United States Patent [19]
Carson et al.

[11] Patent Number: 6,078,872
[45] Date of Patent: *Jun. 20, 2000

[54] METHOD FOR SUPPRESSING NOISE IN MEASUREMENTS

[75] Inventors: Paul L. Carson, Goleta; Louis A. Madsen; Garett M. Leskowitz, both of Pasadena; Daniel P. Weitekamp, Altadena, all of Calif.

[73] Assignee: California Institute of Technology, Pasadena, Calif.

[*] Notice: This patent is subject to a terminal disclaimer.

[21] Appl. No.: 09/421,628

[22] Filed: Oct. 19, 1999

Related U.S. Application Data

[62] Division of application No. 09/103,793, Jun. 24, 1998.
[60] Provisional application No. 60/050,701, Jun. 24, 1997, and provisional application No. 60/078,167, Mar. 16, 1998.

[51] Int. Cl.$^7$ .................................................. G01R 13/00
[52] U.S. Cl. ........................... 702/69; 702/193; 324/303; 324/307; 324/309
[58] Field of Search .............................. 702/69, 71, 193; 324/303, 307, 309; 250/291

[56] References Cited

U.S. PATENT DOCUMENTS

| | | | |
|---|---|---|---|
| 4,982,088 | 1/1991 | Daniel et al. | 250/291 |
| 5,499,190 | 3/1996 | Takahashi et al. | 702/71 |
| 5,517,115 | 5/1996 | Prammer | 324/303 |
| 5,585,720 | 12/1996 | Edwards | 324/309 |

OTHER PUBLICATIONS

Sidles et al., "Magnetic–Resonance Force Microscopy", Reviews of Modern physics 67: 249–265, 1995.

Rugar et al., "Force Detection of Nuclear–Magnetic–Resonance", Science 264:1560–1565, 1994.

Sidles, J. A. and D. Rugar "Signal–to–Noise Ratios In Inductive and Mechanical Detection of Magnetic–Resonance", Physical Review Letters 70: 3506–3509, 1993.

Braginsky and Khalili, "Quantum non–demolition", Quantum Measurement, Cambridge, Cambridge university Press, 1992.

Leskowitz et al., "Force–detected magnetic resonance without field gradients," Solid–State Nuclear Magnetic Resonance, vol. 11(1,2), pp. 73–86, 1998.

Abragam, Principles of Nuclear Magnetism. oxford, Clarendon Press, 1961.

Steinfeld, Molecules and Radiation: an Introduction to Modern Molecular Spectroscopy. Cambridge, Mass, MIT Press, 1985.

Sleator et al. "Nuclear–Spin Noise and Spontaneous Emission", Physical Review B Condensed Matter, 1969–1980.

Orrit et al., "Optical sepctroscopy of signal molecules in solids", in Progress in Optics. vol. XXXV, pp. 61–144, 1996.

*Primary Examiner*—Kamini Shah
*Attorney, Agent, or Firm*—Fish & Richardson P.C.

[57] ABSTRACT

Methods for suppressing noise in measurements by correlating functions based on at least two different measurements of a system at two different times. In one embodiment, a measurement operation is performed on at least a portion of a system that has a memory. A property of the system is measured during a first measurement period to produce a first response indicative of a first state of the system. Then the property of the system is measured during a second measurement period to produce a second response indicative of a second state of the system. The second measurement is performed after an evolution duration subsequent to the first measurement period when the system still retains a degree of memory of an aspect of the first state. Next, a first function of the first response is combined with a second function of the second response to form a second-order correlation function. Information of the system is then extracted from the second-order correlation function.

85 Claims, 9 Drawing Sheets

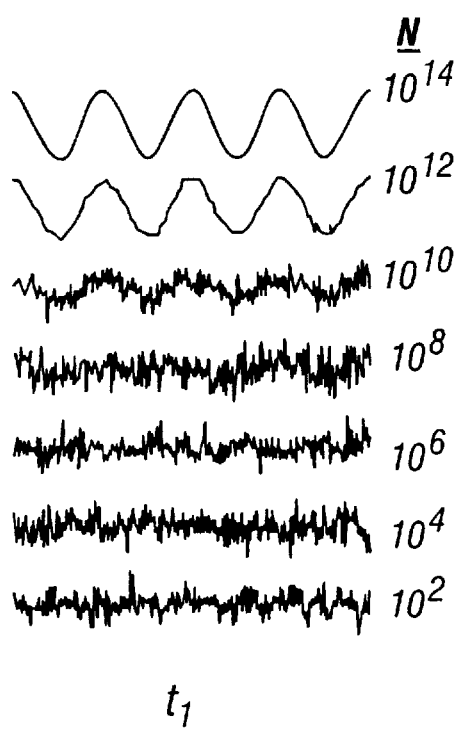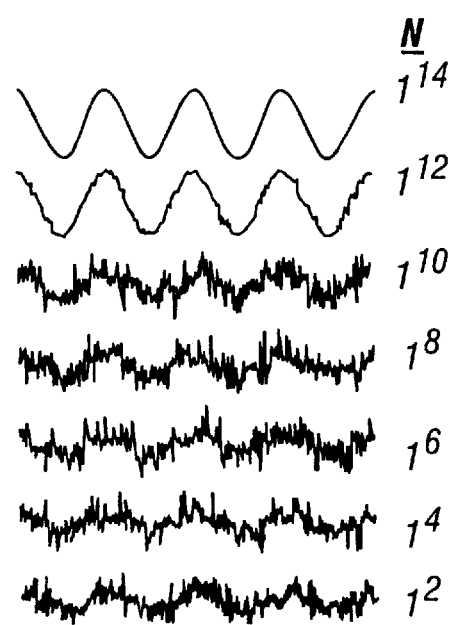
FIG. 5A
FIG. 5B

METHOD FOR SUPPRESSING NOISE IN MEASUREMENTS

RELATED PATENT APPLICATION

This is a divisional of U.S. application Ser. No. 09/103,793, filed Jun. 24, 1998, (pending).

This application claims the benefit of the U.S. Provisional Application Nos. 60/050,701, filed on Jun. 24, 1997, and 60/078,167, filed on Mar. 16, 1998, the disclosure of which is incorporated herein by reference.

U.S. Government may have certain rights in this invention pursuant to NASA Contract Number NAS7-1407.

FIELD OF THE INVENTION

This invention relates to measurements in general and more specifically to methods of using correlated measurements for improving sensitivity, resolution, and information content of measurements.

BACKGROUND

The accuracy and precision in measurement are usually limited by a variety of noise sources. Noise may be caused by sources that are internal or external to a system of interest. For example, instrument noise and environmental noise are external noise. External noise can be reduced by, for example, improving the instrument and isolating the influence of the environment. Internal noise is caused by inherent processes within the system under test. Thermal fluctuations, caused by non-zero operating temperature, and quantum fluctuations, for example, contribute to the internal noise and introduce uncertainty in measured quantities. Such internal noise may be small compared to the external noise in many applications. As the instrument technology and measuring techniques improve, the external noise can sometimes be reduced to a level comparable to or even less than the internal noise. Therefore, in certain applications, the internal noise may become a primary source of noise.

The interaction of an instrument and a sample under measurement can also introduce noise to a measurement. This is called a back action effect. The accuracy or precision of signal detection can be degraded by this back action effect. The measurement problems associated with the internal noise and back action effect can become more significant when the dimension of a system under test or its component parts are microscopic. An example is the damping of the motions of trapped ions in sensitive mass spectrometry measurements by the detection circuit used to detect those motions. See, Lowell S. Brown and Gerald Gabrielse, Geonium Theory: Physics of a Single Electron or Ion in a Penning Trap, Rev. Mod. Phys. 58 (1), 233–311 (1986). This damping may reduce the resolution of the mass spectrum and degrade the precision of the measurement.

The effects of these noise sources in general are present in any system of an arbitrary scale that is sufficiently isolated from its environment so that other noise sources are less important. For devices of a molecular size, the internal nose and the back action effect may be more significant than observation and operation in devices at larger size scales. Noise can be suppressed in a measurement by correlation techniques. A first-order correlation function, for example, is an average of a detected signal such as an electrical current. Since noise is usually random, the first-order correlation function can be used to reduce the effect of the noise. If the signal has a non-zero average, the signal-to-noise ratio can be improved by averaging repetitive measurements of a first-order correlation.

A second-order or higher-order correlation function is an average of a multiplication of two or more measurements of a detected signal. See, e.g., Weissbluth, *Photon-Atom Interactions*, Academic Press, pp. 276–286, San Diego, Calif. (1989). Such a correlation function may be desirable when characteristic fluctuations in the signal as a function of, for example, time or spatial position provide useful information about the system. Given two measurements of a signal $S_b$ and $S_a$ made at different "positions" q in phase space and/or different times, the second-order correlation function is $$<S_2>=<S_b(q_b,t_b)S_a(q_a,t_a)>,$$

where the bracket indicates an average over repetitions of the measurements. Such a second-order correlation function is of particular importance when the average of a signal over repetitions of the individual factors (i.e., the first-order correlation function) would not depend on either position or time. Higher-order correlation functions may also be used for measurements.

When the two measurements differ only in the times at which they were made, the function is an autocorrelation function. If they are measurements of the same signed quantity measured at two times, then the Fourier transform with respect to the time difference $(t_a-t_b)$ is the power spectrum (or spectral density function) of this quantity. The connection of these quantities as a Fourier pair is the Wiener-Khinchin theorem. If $<S_2>$ is independent of the time of the initial measurement, the process is said to be stationary, such as a measurement made with the observed system in a steady-state interaction with the measurement apparatus and its environment. When the position and/or the measured quantity differ between the two measurements, the function is called a cross-correlation function.

SUMMARY

The present disclosure describes techniques of combining separate but correlated measurements to form a second-order or higher order correlation function to suppress the effects of noise in the initial condition of a target system capable of retaining memory of an initial state with a characteristic relaxation time. At least two separate measurements are obtained from the system. The temporal separation between the two separate measurements is preferably comparable to or less than the characteristic relaxation time and is adjusted to allow for a correlation between two measurements.

One embodiment decomposes a measurement into at least four distinct epochs, where all of the epochs, except possibly the first, are comparable to or less than any relaxation time of the system under measurement. In a first epoch, typically no external probe or excitation is applied to the system. In a second epoch, a first measurement of some observable of the system is performed. In a third epoch, the system evolves with or without an external perturbation. In a fourth epoch, a second measurement is performed to measure a second response. Next, a type of second-order correlation function is formed by using the first and second responses and is configured to suppress noise in the initial condition of the system. A third-order or higher-order correlation function may be similarly constructed.

A scalar transformation may be applied to one or more of the responses measured in the second and fourth epochs to enhance suppression of noise. One implementation transforms the first response by a "dispersive" function and forms the second-order correlation by multiplying the transformed first response directly with the second response.

These and other aspects and advantages of the present invention will become more apparent in light of the following detailed description, the accompanying drawings, and the appended claims.

BRIEF DESCRIPTION OF THE DRAWINGS

FIGS. 5A and 5B respectively show calculated detection results of using a conventional first-order correlation technique and a dispersive-operator second-order correlation technique for different total numbers of spins N.

DETAILED DESCRIPTION OF THE PREFERRED EMBODIMENTS

The measurement techniques disclosed herein are applicable to a system on a time scale over which at least partial memory is retained of an initial state of the system. The system's loss of this information is characterized by a relaxation time. At least some effect of a system's initial state remains in the system in a time comparable to or less than the characteristic relaxation time, even when one or more perturbations are made to the system during that time.

An ensemble of nuclear spins in nuclear magnetic resonance measurements is an example of such a system with memory. The spins have a longitudinal relaxation time $T_1$ to describe the population decay from an excited state (one Zeeman state) to an equilibrium state (another Zeeman state) at a rate of $T_1^{-1}$. Hence, the deviation of a population of this state from its equilibrium value is substantially depleted after a time much longer than $T_1$ so that the system no longer has a memory of that particular value of the population of the excited state. This spin system may also have a transverse relaxation time, $T_2$, to describe the coherence time of the relative phases of the nuclear spin states. The characteristic relaxation time for the transverse magnetization of such a spin system is therefore indicated by the shorter time of the $T_1$ and $T_2$. For other observables there are similar relaxation times.

Other atomic and molecular systems can also represent a system with memory. The relevant energy states may be Zeeman states, atomic states, or molecular states. They could as well be states of oscillators, such as mechanical oscillators or electromagnetic fields described as quantum mechanical systems or any other states of a system of interest.

Figure 1:
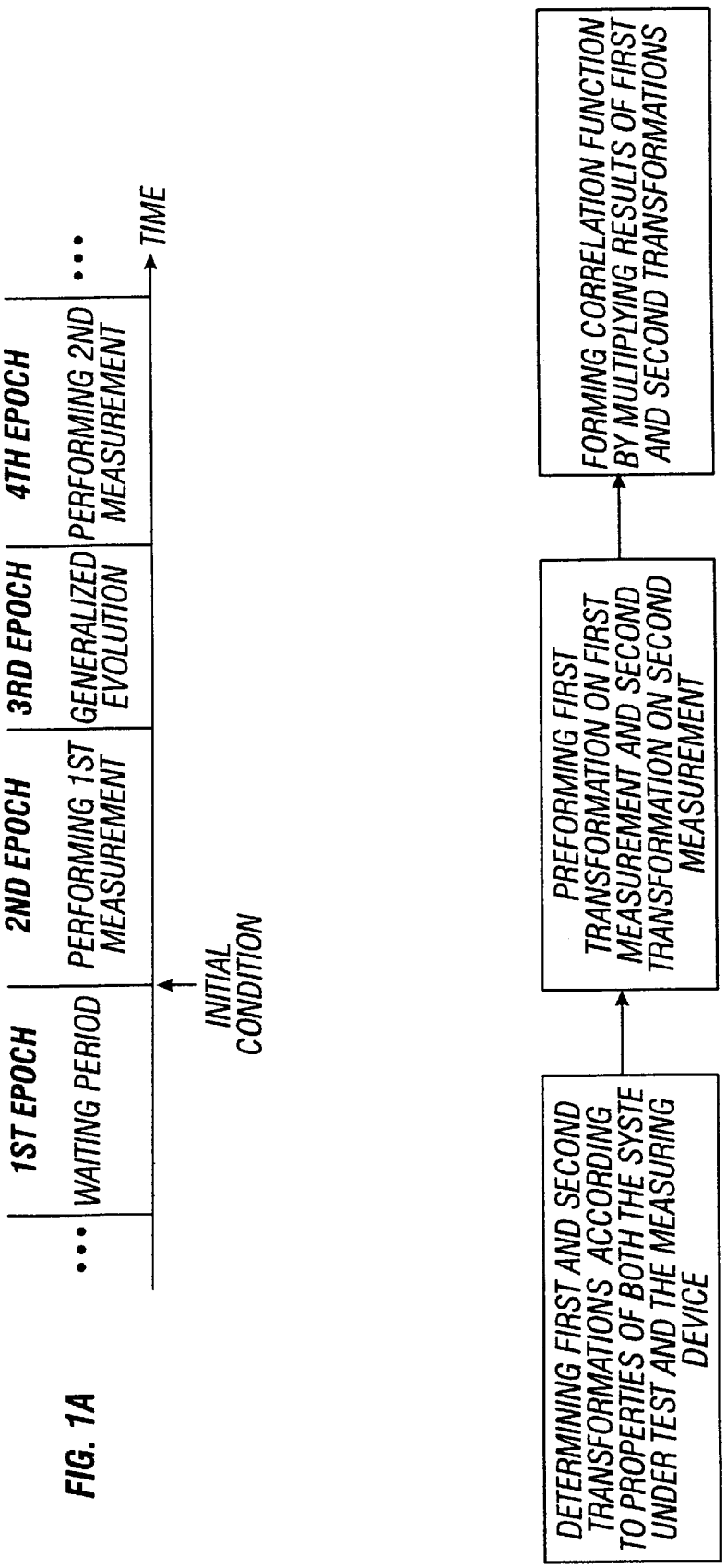
FIG. 1A is a diagram illustrating four epochs within one cycle of a measurement procedure according to one embodiment of the invention.
FIG. 1B is a flowchart of forming a second-order correlation function based on transformations of two different measurements made in one measurement cycle in FIG. 1A.

FIG. 1A shows a time line for one repetition of the events according to one embodiment. A complete experiment may require repeating the steps indicated in the time line with or without modifications to these steps. When no modifications are made, this will be referred to as a repetition. The time line is divided into four epochs: a waiting period, a period for performing a first measurement on the ensemble, a general evolution period, and a period for performing a second measurement.

A first epoch is a waiting period in which the ensemble is prepared for measurements. Examples of this epoch include waiting for the equilibrium nuclear magnetization of a sample in a magnetic field to develop or preparing a non-equilibrium spin state in some way. The waiting period may involve active external intervention to speed up the rate at which the state of the ensemble becomes uncorrelated with the state in which the ensemble is left by a previous repetition. There is no strict requirement that is the state of the ensemble be fully uncorrelated with the previous repetition, but inclusion of such correlation in the analysis would generally be necessary unless it is made small by the waiting period. In the quantitative examples, the waiting period will be assumed to have eliminated correlation between repetitions. It is not required to have some initial order and/or some coherent excitation, so that this waiting period can be relatively short and can leave the ensemble arbitrarily disordered and/or incoherent. For example, NMR measurements can be performed on systems with a high spin temperature at which spins become unpolarized. This is an advantage because creating a reproducible spin polarization, (for example by allowing the spin system to return to the sample temperature) can be the most time-consuming part of an NMR measurement. Especially at cryogenic temperatures, measurements based on spin-lattice relaxation may require too much time to be practical. Creating a disordered state suitable for the next repetition can be a relatively fast process.

The second and fourth epochs are detection or measurement periods. It is during these periods that the system interacts substantially with the measurement apparatus and the response of the interaction is recorded. The system may be electromagnetically manipulated in a desired way, e.g., with incident radiation, to facilitate the measurement. Each measurement period can include measurements at one or more times of one or more quantities of interest. The second measurement period can be either similar to or different from the first measurement period.

The third epoch between the first and second measurement periods is a period of generalized evolution. The generalized evolution period may contain multiple distinct steps. The state of the system changes either passively under internal interactions or actively under a desired external manipulation in this generalized evolution period. Certain parameters of the system, such as frequencies and decay rates, are "encoded" in the system by this evolution.

Upon obtaining the first and second measurements, a second-order correlation function $S_2$ can be constructed. In general, each of the two measurements may undergo a transformation prior to their being combined to enhance noise suppression by the second-order correlation function. Assume a transformation for the first measurement is represented by a scalar function $f_b$ and a transformation for the second measurement is represented by $f_a$, then the transformed measurements are $f_b(S_b)$ and $f_a(S_a)$, respectively, where $S_b$ and $S_a$, respectively, represent first and second measurements (or the "before" and "after" measurements). The second-order correlation function is given by $<S_2>=<f_b(S_b)f_a(S_a)>$. This process is illustrated by a flowchart in FIG. 1B.

Well known methods such as filtering and fitting procedures can be used for each of the two separate measurements in order to obtain the best statistical estimate of $S_b$ and $S_a$, given the data from the two measurement periods. The duration of these measurements is typically shorter than the measurement periods of many conventional measuring techniques. This is because of the need to complete the time line in a time short or comparable to the relaxation time and/or because longer measurement periods would not improve the sensitivity of the second order correlation function. Numerical examples follow. Since the two separate measurements are made in a period during which the system still retains memory of the initial state, the two measurements are correlated by the initial state. This converts the random initial condition noise in many conventional measuring techniques into correlated signals that do not adversely affect the detection or do so to a lesser extent than in conventional methods.

The first and second transformations $f_b$ and $f_a$ may be in various forms depending on the properties of the system under measurement. The exact transformations should be configured to enhance or optimize the noise suppression of the resultant second-order correlation function. The simplest transformations $f_b$ and $f_a$ are unity transformations, i.e., $f_b(S_b)=S_b$ and $f_a(S_a)=S_a$ so that $<S_2>=<S_bS_a>$.

The four epochs shown in FIG. 1A complete one measurement cycle for obtaining two separate measurements of a system. One measurement cycle can be used to form a second-order correlation function. In order to achieve certain correlation between outcomes of first and second measurements, it is desirable to set the temporal separation of the two measurements (i.e., the duration of the third epoch) within a range that is comparable to or less than the characteristic relaxation time so that the system still retains memory of the first measurement when the second measurement is performed. In addition, depending on the properties of the system and external manipulation in the third epoch, the temporal separation can be adjusted within the above range, i.e., within the range for which the two measurements are correlated with each other. This correlation may be modulated as a function of non-identical repetitions of the experiment and even cross through zero (i.e., become transiently uncorrelated for certain generalized evolution periods that appear in a set of related measurements). In addition, additional pairs of the third and fourth types of epoch could be appended to obtain a third order or a higher order correlation function.

The technique shown in FIGS. 1A and 1B in general covers any and all repeated measurements of a system, with a period of coherent system evolution separating at least two of the measurements. During this period, the random deviation of the signal for each measurement from its expected value is at least partially correlated among the measurements, with the possibility that this correlation is modulated during the evolution period. The measurements can be performed in different ways. For example, a single signal detector can be used to obtain the measurements of a single sample at different times; two or more different or similar detectors may be disposed relative to the single sample at different locations to obtain measurements at the same time or different times; or measurements can be done on two or more samples with one or more detectors.

Figure 2:
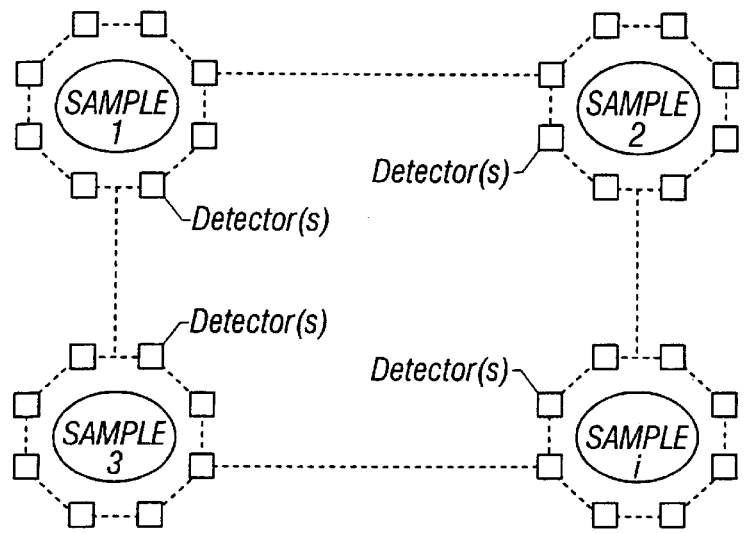
FIG. 2 is a block diagram illustrating the multiplicity of possible sample and detector arrangements, as well as the multiplicity of possible detector coupling arrangements.

FIG. 2 is a generalized schematic of the multiplicity of possible sample and detector arrangements. It may be advantageous to use certain mathematical functions of each measurement (with the functions not necessarily the same for different measurements) as factors in a product involving either all of the measurements or subsets of the measurements. This product is treated as the signal that is averaged over for repetitions of the experiment. The correlation of initial-condition noise among the measurements can improve the signal-to-noise ratio compared to first-order techniques. Thus it is useful to take the products of measurements for which the underlying observable of interest is correlated in the functions so multiplied. FIG. 2 shows one embodiment having one or more independent samples and one or more detectors for each sample for parallel and/or sequential measurements. Some of the advantages accrue because the use of correlated measurements allows each sample to be made small enough that the simultaneous observation of many samples is practical and recommended relative to the alternative of combining the samples in a larger apparatus.

Therefore, the technique of FIG. 1A may use multiple detectors which are either always coupled, conditionally (dynamically) coupled, always uncoupled, or combinations of these arrangements. The scheme may also use different detectors to make measurements on different parts of the same sample or on different samples. The scheme could also generate and exploit multiple aspects of each measurement, such as the various Fourier components of each measurement.

One aspect of the technique shown in FIG. 1A is to explore the relation of certain sources of noise during a period in which a system retains memory. Some of these sources of noise have been largely neglected in many conventional measuring techniques. One of these is initial condition noise, which is defined as uncertainty in a desired observable which is a result of intrinsic uncertainty in a set of nominally perfect measurements on the ensemble of systems under test. Such uncertainty may include thermal fluctuations, which are an aspect of any system at a nonzero temperature, and quantum mechanical uncertainty in measurements of the system, which can persist even in the hypothetical limit of zero temperature. In addition there may be additional initial condition uncertainty due to inadequate control of any thermodynamic constraint, including temperature. Number-density fluctuations of molecules under study also contribute the uncertainty. The fluctuations in an initial condition that persists at fixed thermodynamic constraints are equilibrium properties (the area of the spectral density function or the zero time point of the corresponding correlation function). When these fluctuations for an observable of interest are larger than the mean of that observable, the SNR of the first-order measurement can fall below unity and the fluctuations dominate the second order correlation function of that observable. One feature of the present method is a prescription for making novel time-domain measurements based on extensions of the second-order correlation function which provide better and/or different information, especially in this limit where fluctuations dominate mean values.

In order to make effective measurements, it is often desirable to modulate the observable of interest in some coherent fashion during the time in which it drives a detection apparatus. This has the effect, for the duration of the modulation, of convoluting the spectral density of the detector with the spectrum of the modulation. Modulation is particularly important for observables whose spectral density would otherwise peak at the zero frequency, since the effects of numerous noise mechanisms increase at low frequencies. Thus, quasi-constants of the system are usually measured at the modulation frequency. Nevertheless, it is possible to use equilibrium statistical mechanics to estimate their distributions. Some of the preferred embodiments make use of modulation schemes of this sort.

In other cases, the fluctuation of interest will, even in the absence of any experimental modulation of the observable, be at a non-zero frequency. Then the detection apparatus will measure that frequency range of the spectral density that couples to it. The second-order, SQUID NQR experiment by Sleator is such a case. The steady-state spectral density of the rf magnetization of the system, unperturbed by incident rf, provides the signal.

The measuring technique shown in FIGS. 1A and 1B can be illustrated by measurements in force-detected nuclear magnetic resonance ("NMR"). Nuclear magnetic resonance is a known technique for detecting certain properties of materials having atoms with nuclear magnetic moments associated with non-zero nuclear spins. Nuclear spins are intrinsic properties of atomic nuclei and can be used as part of noninvasive probes for analyzing many materials. NMR spectroscopy and NMR imaging have been widely used to analyze the electronic and molecular structure, motion and material properties of a wide variety of samples.

In the absence of a magnetic field, the equilibrium orientations of nuclear moments are random and the energies associated with different orientations of a nuclear moment are small and largely indistinguishable from one another. In the presence of an external static magnetic field, these nuclear magnetic moments acquire a net (average) orientation and assume certain allowed quantized energy levels known as nuclear Zeeman levels. A transition may be induced between an appropriate pair of Zeeman levels by illuminating a sample with electromagnetic radiation in resonance with the transition between two Zeeman levels. The populations and/or phase coherence between nuclear spin states can be changed by such a resonant excitation. In practical applications, the magnitude of the static magnetic field is usually within a range such that the energy separation between two adjacent nuclear Zeeman levels corresponds to the radio frequency ("rf") spectrum ($\sim 10^6 - 10^9$ Hz). Accordingly, a time-varying magnetic field for modulating the magnetization of a sample is within the rf range.

Leskowitz et al. developed a "BOOMERANG" method of force-detected NMR in which a sample is placed in a homogeneous static magnetic field and an NMR signal is detected by measuring the motion of one or more magnetic sensors. The BOOMERANG method provides for better observation of magnetization, enhanced resolution and no gradient. See, U.S. patent application Ser. No. 08/872,528, filed on Jun. 11, 1997 and Leskowitz et al. "Force-detected magnetic resonance without field gradients," Solid-State Nuclear Magnetic Resonance, Vol. 11(1,2), pp. 73–86 (1998), which are incorporated herein by reference. In the BOOMERANG method, each measurement separately is proportional to the longitudinal spin angular momentum $I_z$ of some particular magnetic isotope in the sample, which is in a static magnetic field along the z-axis. Cyclic inversion of the longitudinal spin magnetization drives a change in the amplitude of a nearby magnetic oscillator, and this change is measured.

Figure 3:
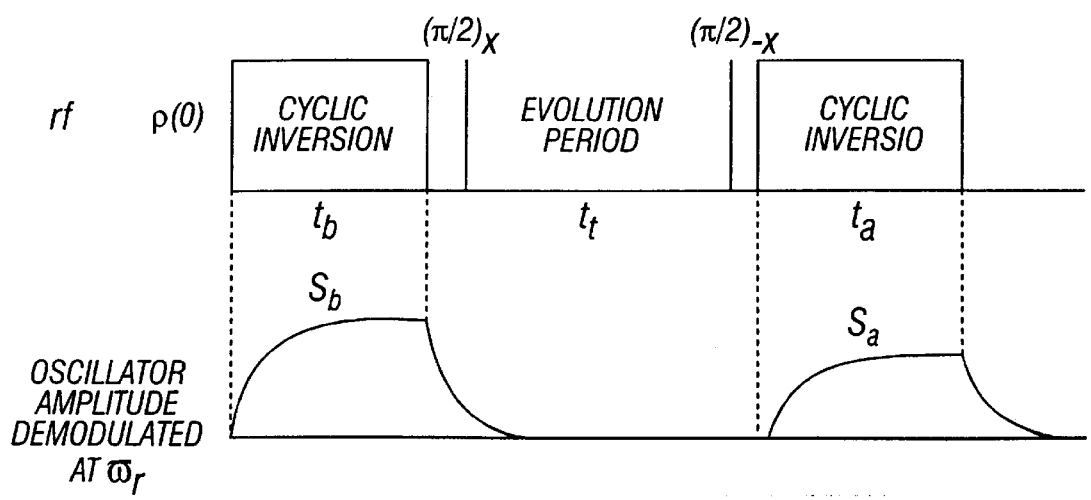
FIG. 3 is a diagram illustrating an exemplary timing diagram of the measuring technique of FIG. 1A for a force-detected NMR measurement.

Two separate measurements are needed in order to obtain a second-order correlation function of the NMR signal. The timing diagram based on the measuring technique of FIG. 1A is shown in FIG. 3. A first cyclic inversion is performed for a duration $t_b$ after a waiting period. After an evolution period $t_1$, a second cyclic inversion is performed for a duration $t_a$. Two external spin manipulations are applied to the sample during the evolution period in the simplest example of the BOOMERANG experiment. First, a $\pi/2$ rf pulse is applied to the sample to convert initial longitudinal magnetization into transverse magnetization. After time $t_1$ at the end of the evolution period, another $\pi/2$ rf pulse is applied to the sample to convert a transverse component of the magnetization that survives the evolution period back into longitudinal magnetization. The evolution period $t_1$ is less than or comparable to the spin relaxation times which damp the coherent spin evolution induced during $t_1$. One difference between the time line of this second-order BOOMERANG and the first-order BOOMERANG experiment is that a driving/detection step is performed first, prior to the generalized evolution period $t_1$.

The two signals that are measured before and after the evolution period are fit to give, respectively, random deviates $[I_z]_b$ and $[I_z(t_1)]_a$ of the spin angular momentum projection at the end of the first detection period and the beginning of the second detection period. These quantities exemplify the quantities $S_b$ and $S_a$, respectively. We are introducing here a general notation of the form $[X(t)]_i$, where X is a quantum-mechanical operator and the subscript i includes any labels other than times per se needed to label the measurement. The time variables denoted in parentheses, as arguments of the operator, will be viewed as "dates", in contrast to continuous variables. Their precise meaning will depend on the representation (e.g. Schrodinger vs. Heisenberg representation) being used for calculation. The quantities $[X(t)]_i$ so denoted are, in general, obtained as best fit parameters to data obtained by a measurement that takes place over a duration, which for compactness is not explicitly included in the notation. These durations are, for example, the lengths $t_b$ and $t_a$ of the respective measurement periods in FIGS. 1A and 3. The absence of a time label or the time zero indicates the end point of the before measurement.

Note that the random deviates of the spin angular momentum are signed quantities. The product of these two estimates, obtained for each repetition of the time line, is the random deviate $[S_2(t_1)]=[I_z]_b[I_z(t_1)]_a$ of the desired correlation function. The expectation value $<S_2(t_1)>$ of this product can be non-zero, even when the expectation value over repetitions of the separate signals is zero, as for an unpolarized spin system. Thus it may be averaged over repetitions of the procedure to improve the signal-to-noise ratio.

A special case is where all products of measurements, for a certain value of $t_1$, may be added together to provide an experimental estimate of $<S_2(t_1)>$. This average may be useful even when the sensitivity of the individual measurements is inadequate to usefully distinguish the individual eigenstates of the observable or to make any useful binning (vide infra) of the individual measurements. Repetition of the experiment leads eventually to usable sensitivity for $<S_2(t_1)>$. The theoretical interpretation for the case where, regardless of the measured value, the products are just added together will be notated for a system whose state subsequent to the waiting period is described by the density operator $\rho(0)$. If the commutator $[\rho(0), I_z]=0$, then $<S_2(t_1)>=Tr\{\rho(0) I_z I_z(t_1)\}$ is the quantity to be calculated from theory for comparison to experiment. Here the operator $I_z(t_1)$ is the operator $I_z$ propagated through the evolution period $t_1$, in the sense of the Heisenberg equation of motion, including possible dissipative effects. This formalism is used here to quantify the SNR advantages of the present method.

Certain advantages and novelty of the present measurement technique can be demonstrated by using calculations of statistical moments of expected nuclear magnetic resonance signals for a system of N spins-½ in the BOOMERANG force-detected NMR experiment. This method allows for high-resolution spectra to be encoded during evolution. For this numerical example the N spins are assumed to be isochronous. After the possible waiting period, the first (or "before") measurement samples a random deviate $[I_z]_b$ from the underlying distribution of possible initial conditions for the rest of the experiment. A resonant rf pulse is then applied to the spin system to generate coherence, followed by a period of coherent evolution (assumed for the present calculation to be free of dissipation). At the end of the evolution period, another resonant rf pulse is delivered to convert the encoded coherence into encoded spin population differences. This step is followed by the second measurement of longitudinal magnetization $[I_z]_a$. Even when the spin noise dominates the expected signal for either or both of the individual measurements, the spin noise will be correlated between the first and second measurements. This correlation will be modulated during the evolution period and so encoded with the frequencies of interest.

More specifically, the Hamiltonian for the system can be written as $$H = -\hbar \omega_L I_z,$$

where $\omega_L$ is the Larmor precession frequency of the spins. The expected value for the first measurement at thermal equilibrium is $$\langle I_z \rangle = \frac{PN}{2},$$

where P is the spin polarization defined by $P = \tanh(\hbar \omega_L / 2kT)$. The quantum uncertainty in this measurement is $$\Delta I_z = \frac{1}{2}\sqrt{N(1-P^2)}.$$

Figure 4A:
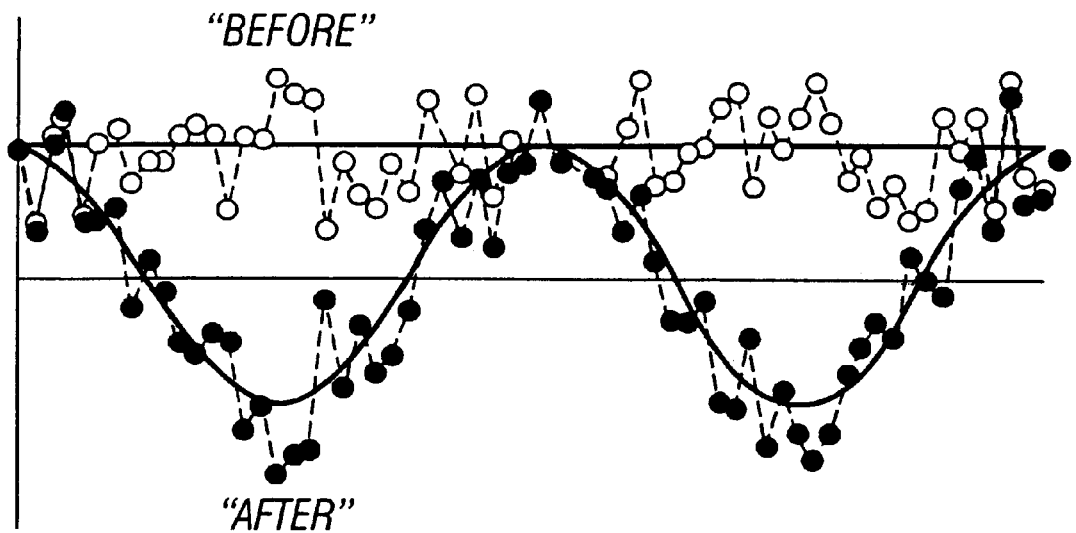
FIGS. 4A and 4B are diagrams depicting calculated signals from the two measurements as functions of time for, respectively, two different total numbers $N=10^{11}$ and $N=10^2$ of isochronous spins with polarization $P=10^{-5}$.
Figure 4B:
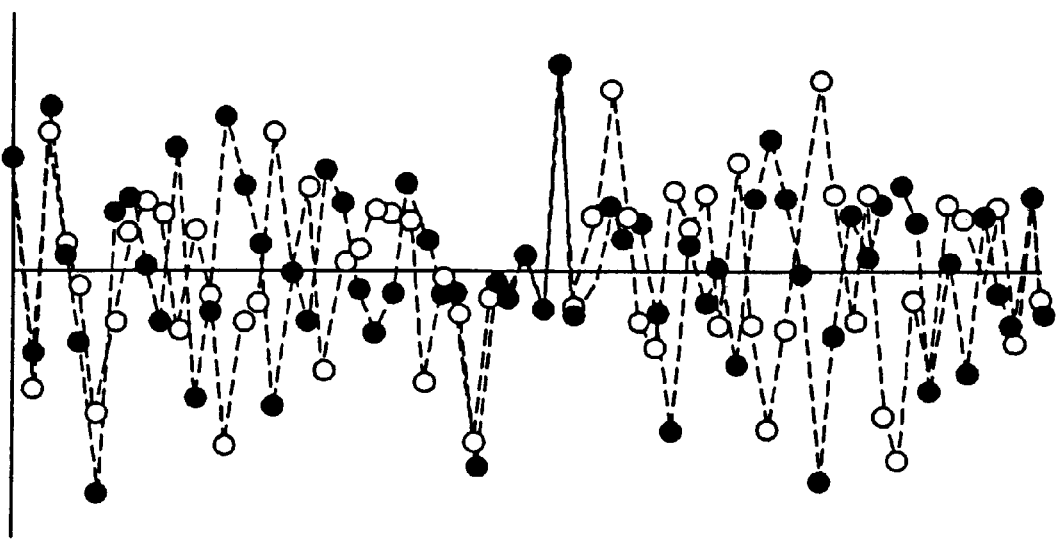

FIGS. 4A and 4B depict calculated signals from the two measurements as a function of time, respectively, for two different total numbers $N=10^{11}$ and $N=10^2$ of isochronous spins with polarization $P=10^{-5}$. Open circles represent "before" measurements, and closed circles represent "after" measurements for each $t_1$ point. The amplitudes are scaled independently for the two values of N. Instrument noise is taken to be negligible compared to the quantum noise in these calculations. The effect of non-negligible instrument noise will be discussed below.

The calculation indicates the degree of correlation between each "before" measurement and its corresponding "after" measurement. The spin noise is highly correlated in the vicinity of local maxima in the signal where the evolution operator has cyclically returned to the identity operator (neglecting relaxation). Likewise, the spin noise is highly anti-correlated in the vicinity of local minima. At nodes in the signal, the spin noise is uncorrelated since a new distribution of total spin eigenvalues for P=0 is sampled at these $t_1$ points by the second measurement, regardless of the longitudinal polarization at the start.

The simplest procedure for exploiting the correlation in spin noise between the first and second measurements is to multiply the two measurements for each $t_1$ point. Referring to FIG. 1B, this corresponds to unity transformations of both measurements: $f_b(S_b)=S_b$ and $f_a(S_a)=S_a$. Accordingly, a respective second-order correlation function, $<S_2(t_1)>$ can be expressed as $$\langle S_2(t_1) \rangle = \frac{1}{R}\sum_{r=1}^{R} [I_z(0)]_{b,r}[I_z(t_1)]_{a,r}.$$

The subscript r indexes repetitions of the experiment for a large total number of repetitions R. The quantum calculation of the corresponding expectation value of this product of first and second measurements is written in the Heisenberg representation as $$<S_2(t_1)> = Tr\{\rho(0)I_z(0)I_z(t_1)\} = <I_z(0)I_z(t_1)>.$$

The quantum uncertainty in the product of the two measurements is calculated as $$\Delta S_2(t_1) = \sqrt{\langle [I_z(0)\,I_z(t_1)]^2 \rangle - \langle I_z(0)\,I_z(t_1) \rangle^2}.$$

The expectation value and quantum uncertainty for this example of the second-order method can be derived exactly as follows for arbitrary P and N:

$$\langle S_2(t_1) \rangle = \langle I_z(0)\,I_z(t_1) \rangle = \frac{N}{4}[1 - P^2(N-1)]\cos \omega_L t_1$$

$$\Delta S_2(t_1) = \frac{1}{4}\sqrt{N^2 + P^2 N^2(N-1) + [N(N-2) + P^2(3N^3 - 11N^2 + 8N) - P^4(4N^3 - 10N^2 + 6N)]\cos^2 \omega_L t_1}$$

These two quantities are essentially independent of polarization in the regime where $P\sqrt{N} \ll 1$. In this regime the signal-to-quantum-noise ratio for the second order scheme is approximated by $$SNR_{q,2} \cong \frac{\sqrt{N} \cos \omega_L t_1}{\sqrt{N + (N-2)\cos^2 \omega_L t_1}}$$

This SNR is also largely independent of N, since N appears to the same order in both the numerator and the denominator. One feature of this second-order correlation technique is that the quantum noise retains a $t_1$ dependence even for vanishing P and large N. For the corresponding first-order "ordinary" NMR experiment, the spin noise in this regime leads to SNR$\ll$1. Hence, the improvement in SNR by using the procedure of the present invention is on the order of $(P\sqrt{N})^{-1} \gg 1$.

Spin noise begins to dominate the ordinary signal when the distribution of total spin angular momentum in the initial condition starts to significantly overlap with zero. This leads to an increasing number of measurements in the signal average (ergodic ensemble average) whose sign is opposite to the sign of the average. The multiplication scheme corrects for this sign fluctuation and converts repetitions of the experiment from destructive to constructive contributors to the signal average.

Other non-unity transformations $f_b$ and $f_a$ may also be used to construct various second-order correlation functions based on the same measurements as in FIG. 3. For example, a possible correction for the fluctuations is to multiply each "after" measurement for a given $t_1$ point by the reciprocal of its corresponding "before" measurement, i.e., $f_b(S_b)=1/S_b$ and $f_a(S_a)=S_a$. This division scheme has value for $t_1$ points where the expected value of the "before" measurement is large compared to the total fluctuations. The quotient, however, suffers large fluctuations at $t_1$ points where the spin noise is uncorrelated and the total fluctuations are larger than the average signal.

A scheme can be used to correlation functions that combine the advantages of the multiplication and division schemes while suppressing their disadvantages. It has been shown using calculations that the "before" measurement may be transformed by a "dispersive" function to significantly improve the signal detection in some applications, such as BOOMERANG force-detected NMR. One embodiment of the operator for transforming the before measurement in the "dispersive-operator scheme" is $$f_b(I_z) = \frac{1}{\frac{\zeta}{I_z} + \frac{I_z}{\zeta}} = \frac{\zeta I_z}{\zeta^2 + I_z^2}.$$

where $\zeta$ is an optimization scaling parameter, which can be adjusted to optimize the SNR of the correlation function. In the regime where quantum noise dominates, the optimum choice for $\zeta$ is roughly equal to the quantum uncertainty in $I_z$:

$$\sigma_{Iz} = \frac{1}{2}\sqrt{N(1-P^2)}$$

The Heisenberg representation operator for the "after" measurement of $I_z$ is $I_z(t_1) = I_z \cos \omega_L t_1 + I_x \sin \omega_L t_1$ The final signal is computed as $$\langle S_2(t_1) \rangle = \left\langle \frac{\zeta I_z(0)}{\zeta^2 + I_z^2(0)} I_z(t_1) \right\rangle.$$

FIGS. 5A and 5B respectively show calculated detection results of using (a) the first-order and (b) the dispersive-operator scheme for different total numbers of spins N. The polarization is fixed at $P=10^{-5}$ for all simulations and each transient is scaled independently. Modulated signal is noticeable above the noise in the dispersive-operator scheme (FIG. 5B) even for a low spin density of N=100, while the first-order correlation technique of an NMR signal in FIG. 5A requires roughly $N=10^{10}$ spins to achieve the same signal-to-noise ratio. This indicates an improvement of about eight orders of magnitude in the sensitivity of the present method to the prior art method under these conditions.

Figure 6:
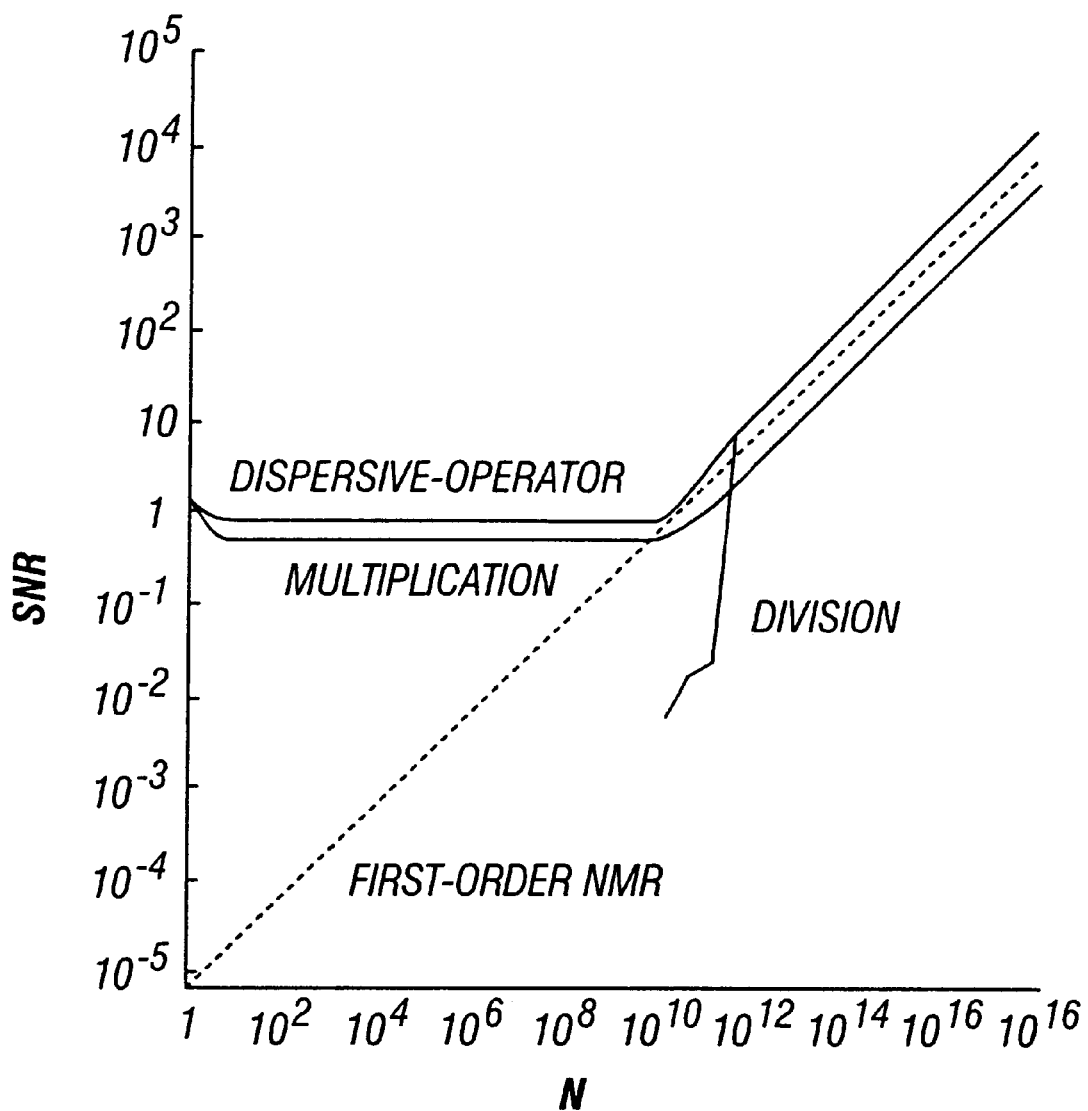
FIG. 6 is a diagram showing Monte Carlo simulations of the signal-to-quantum-noise ratio of the integrated NMR spectrum, neglecting relaxation, for various detection schemes.

FIG. 6 shows Monte Carlo simulations of the signal-to-quantum-noise ratio of the integrated NMR spectrum, neglecting relaxation, for detection schemes using the conventional first-order correlation technique, the direct multiplication second-order-correlation version of the present invention, the dispersive-operator version, and the division version. The simulations assume that instrument noise is negligible compared to quantum noise. The improvement in SNR is by orders of magnitude for the multiplication and dispersive-operator schemes for $P\sqrt{N} \ll 1$. Therefore, SNR can be significantly improved over the first-order correlation technique by using properly constructed second-order or higher order correlation functions.

One aspect of the invention is to use properly-formed second or higher order correlation functions to improve the SNR of measurements even when instrument noise dominates the internal noise (such as quantum noise). The instrument noise need not be correlated with either the signal, the initial-condition noise of the system, or even with itself from one measurement to the next.

Figure 7:
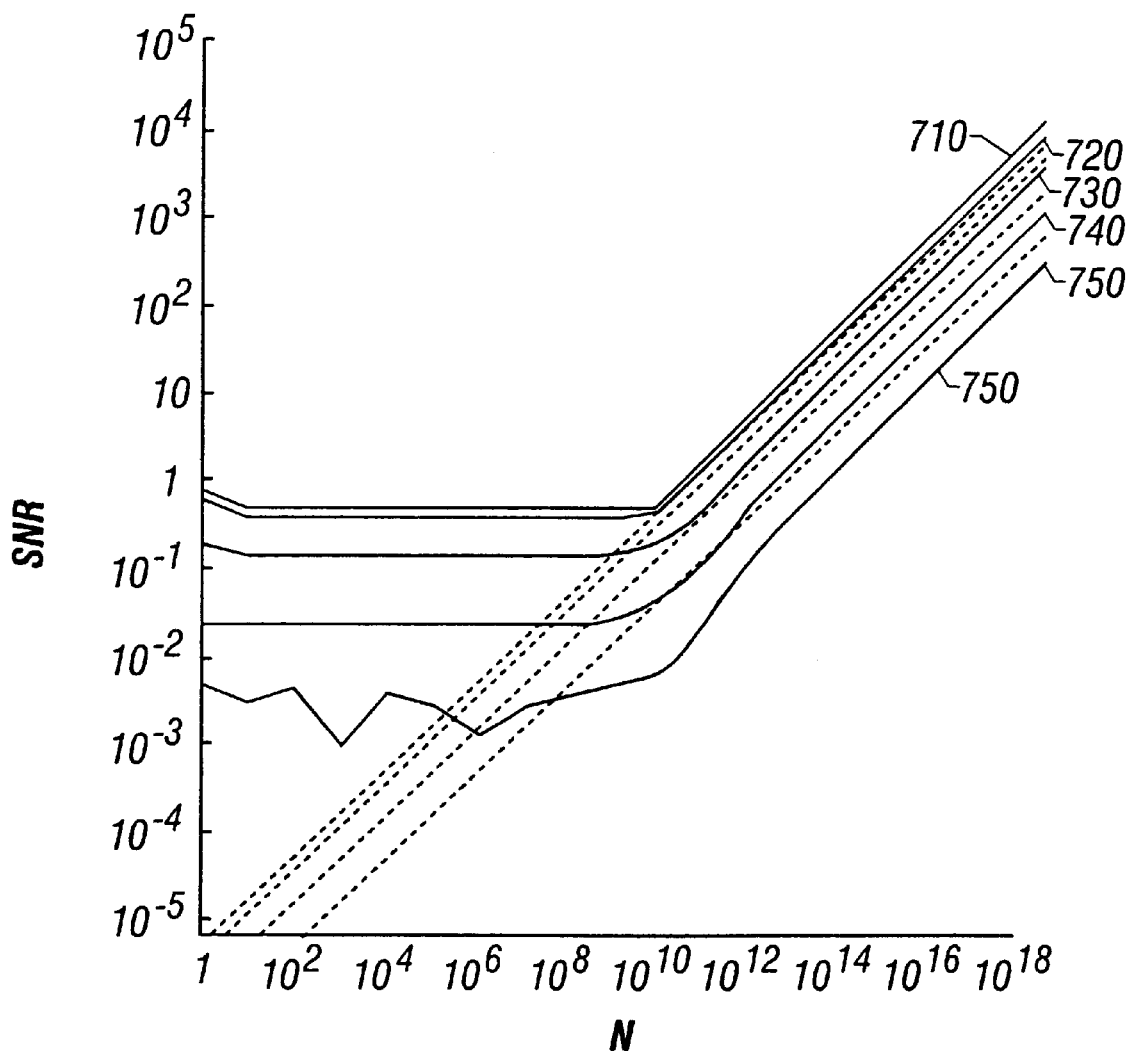
FIG. 7 is a diagram showing a series of Monte Carlo simulations of SNR vs. number of spins N using the dispersive-operator version of the method with uncorrelated instrument noise added to each measurement in an NMR experiment for a spin polarization of $P=10^{-5}$.

FIG. 7 shows a series of Monte Carlo simulations of SNR using the dispersive-operator version of the method with uncorrelated instrument noise added to each measurement. The spin polarization is again fixed at $P=10^{-5}$. The value of the scaling parameter $\zeta$ is chosen to be one half of the root-mean-square sum of the quantum noise and instrument noise, which is not necessarily optimized. Each curve represents a fixed ratio of instrument noise $\sigma_{instr}$ to quantum noise $\sigma_{Iz}$, where the quantum noise is a function of N. Curves for $\sigma_{instr}/\sigma_{Iz}$ equal to 0.01, 0.03, and 0.1 overlap with one another as indicated by curve 710 and produce the highest SNR at every N. Curve 720 represents the SNR for $\sigma_{instr}/\sigma_{Iz}=0.3$. Curves 730, 740, and 750, in order of decreasing SNR, represent values of $\sigma_{instr}/\sigma_{Iz}$ of 1, 3, and 10, respectively. In comparison, dashed lines show the SNR for the simulation of the corresponding first-order experiment using the same values for instrument noise as used in the second-order calculations. SNR decreases from one dashed line to the next for increasing instrument noise relative to quantum noise.

As an example of the advantage in applying the present method to improve the SNR in a realistic experiment, quantum-noise-limited spectra have been simulated for the multiplication version of the method and the corresponding conventional first-order method assuming a cubic sample of a silicate crystal 2 microns on a side with natural abundance $^{29}$Si (spin ½). The number of spins used in the calculation is $N=6\times10^9$ and room temperature polarization is assumed in a static magnetic field of 2 Tesla, which corresponds to $P=1.4\times10^{-6}$. A 512-point time domain transient is simulated for each spectrum, with 1000 repetitions of the experiment.

Figure 8A:
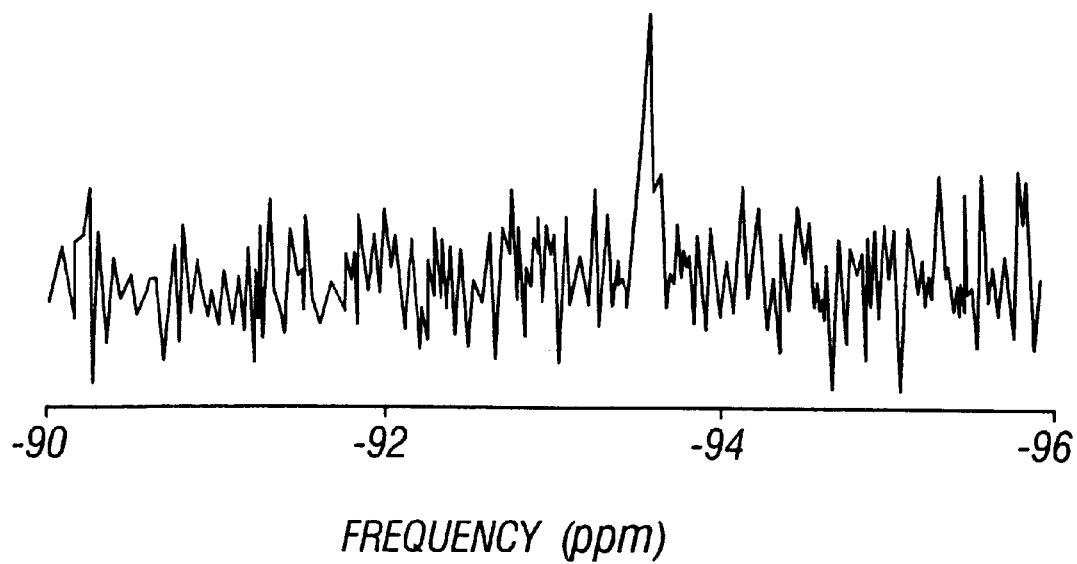
FIGS. 8A and 8B show approximated quantum-noise-limited spectra for (a) first-order pointwise NMR and (b) second-order pointwise NMR, respectively.
Figure 8B:
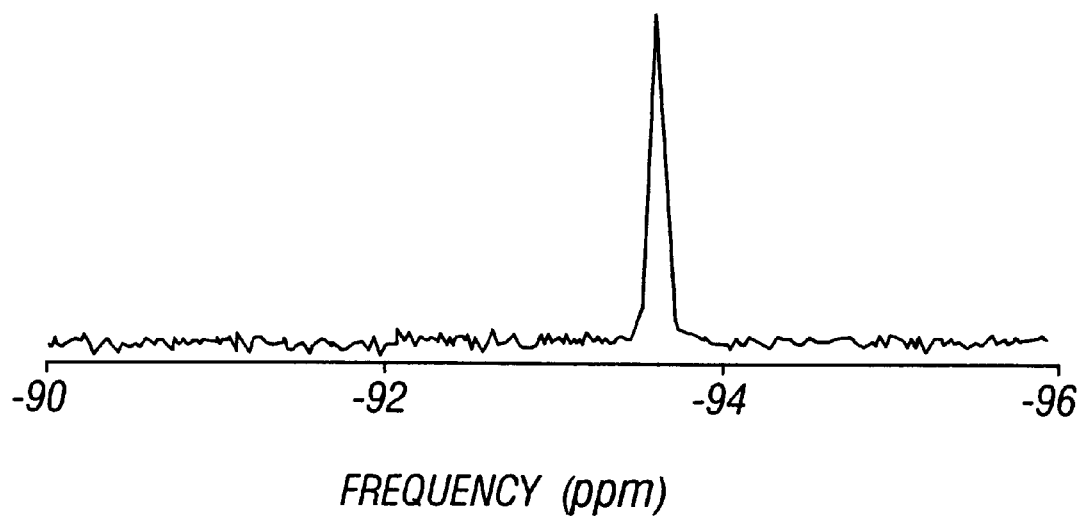

FIGS. 8A and 8B show approximated quantum-noise-limited spectra for (a) first-order pointwise NMR and (b) second-order pointwise NMR. The simulation indicates a significant improvement in signal-to-noise ratio of the second-order correlation NMR measurement over the conventional first-order measurement. It is noted that as the number of spins decreases, the signal in the first-order experiments disappears quickly into the noise, whereas the quantum-limited SNR in the second-order experiment using techniques of the present invention remains substantially unchanged.

The performance of the present measuring technique can be enhanced by binning different second-order correlation functions, i.e., the products $S_2(t_1)$, prior to further analysis, according to the value of the first and/or second measurement. Such binning may become increasingly useful as the accuracy of the measurements approaches the accuracy needed to assign the spin system to particular eigenvalues (or narrow subspaces of possible eigenvalues) of the measured observable. In general, qualitatively different information can be obtained by calculating from the same data different averages <$S_2(t_1)$> using different linear combinations of the products of random deviates so binned.

For example, by adding together only those measurements in which a particular eigenvalue of $I_z$ is measured both before and after the evolution period, an auto-correlation function of the projection operator onto this manifold can be obtained. This autocorrelation function, which is obtained, e.g., by an evolution period pulse sequence similar to that of FIG. 3, can include the frequencies of magnetic-dipole forbidden coherences. Hence, multiple-quantum spectra of uncoupled spins becomes possible without either the extended preparation or the mixing period normally needed in time-domain Fourier transform spectroscopy. Therefore, the present measuring technique does not require a spin-coupling network and can in general apply equally to coupled or uncoupled spins. Also, because the dephasing rates limit the length of preparation and mixing periods, a procedure that replaces them by before and after observations can make practical multiple-quantum spectroscopy of spins which are too weakly coupled to be put into the desired multiple-quantum superposition by way of their couplings. These weak couplings, providing in well-known ways information on molecular structure, would be apparent in the second-order interferogram as a function of $t_1$.

Various embodiments of the present technique can be applied to mitigate various problems in a range of measurements that can be repeated on an ensemble. One important source of noise that is addressed is the uncertainty in measured quantities of interest that results from the distribution of initial conditions of the ensemble of systems under test. Many of the measurement problems addressed are most commonly encountered when the system under test or its component parts are microscopic in size. Of particular interest is spectroscopy, the measurement of the internal states of matter by way of their interaction with electromagnetic fields. For example, the present technique can be applied to various measuring schemes in coherent spectroscopy. Coherent spectroscopy, including time-domain coherent spectroscopy, provides a useful analyzing tool for many applications. See, Abragam, *Principles of Nuclear Magnetism*. Oxford, Clarendon Press (1961) and Steinfeld, *Molecules and Radiation: An Introduction to Modem Molecular Spectroscopy*. Cambridge, Mass., MIT Press (1985). The term coherent applies to the nature of the time evolution of the system under test and/or reference systems within the spectrometer with which the quantities to be measured interfere. The property of the system, on which each measurement depends, may be a signed quantity or amplitude, such as an electromagnetic moment or mechanical displacement, or a positive quantity, such as an intensity or power or rate of photon counting. We note that in general these valuable methods are first order methods and could in a manner apparent to practitioners of these methods be converted into second order methods under the current invention. Such conversion would allow the goals of such methods to be obtained with sensitivity advantages of the present methods.

The present technique may be used to incorporate any spectroscopic experiment by arranging that the desired evolution of the spectroscopic system occurs during $t_1$ (i.e., between two measurements on the system). Preferably, the present technique is used in a time-domain experiment in which the interval $t_1$ is incremented and the spectrum is obtained by Fourier transformation with respect to $t_1$. Multidimensional experiments and frequency-domain experiments and any other time-domain experiments may also be incorporated in this period in ways that are obvious extensions. In some cases, other sets of experimental variables, such as time intervals or the frequencies, amplitudes, or phases of irradiation, will substitute for $t_1$ in ways that are known to practitioners of modern spectroscopy. In all these cases of the present method which can be described as converting prior art first-order measurements to second-order measurements, the algorithm is to make the before measurement in the first detection period, proceed with the steps of the first-order prior art (including its detection period, which comes the after measurement), and construct the possible second-order correlation functions of interest by repetition, as prescribed by the first-order procedure being so adapted.

The present technique is generally applicable to any method of measuring spin magnetization or other internal properties of molecules or other systems. It is of value whenever the fluctuations of the observable of interest are comparable or larger than its expectation value, so pointwise first-order correlation function measurements or real-time methods would suffer from poor reproducibility due to the uncertainty of the initial condition. This technique does not require that the evolution of interest occurs during detection. This would, in general, prevent the separate optimization of sensitivity, resolution and information content; however, these optimizations are readily achieved within the context of the present method.

The generalization of this procedure to involve more than two measurements separated by some manipulation of the spectroscopic system is also useful. For example, if in the magnetic resonance embodiment the "before" measurement resulted in an estimate $[I_z]_b$ whose magnitude was much smaller than the uncertainty in the total spin angular momentum, then a pulse (e.g., a $\pi/2$ pulse) or other manipulation or evolution could be used to change the measurement statistics and another "before" measurement taken to replace the first "before" measurement, with the possibility that the magnitude of this second trial is larger and would thus increase the signal-to-noise ratio in the subsequent correlation function with the after measurement. Such a strategy, and many related ones in which other known types of spectroscopic manipulation would be interspersed with measurements, can be used for measuring correlation functions of order higher than two.

Another context in which hither-order correlation functions are used is the analysis of the nonlinear response of matter to light to up to several incident pulses of light. Here the measurement of the emitted light takes place during or after the time evolution of interest. Elements of the method of the present invention which are absent from that work are repeated measurements interspersed with coherent manipulation of the system on the time scale of its relaxation and the multiplication of quantities derived from such separate measurements in constructing the spectra or time-domain interferogram of interest.

As illustrated in the above examples, an important area of application of the present invention will be magnetic resonance. Second and higher order correlation functions have been used in NMR measurements. In the method of stochastic magnetic resonance, a pseudo-random excitation of the spin system near its resonant (Larmor) frequencies elicits a pseudo-random response in the transverse (precessing) magnetization of the spins. The response as measured and interpreted is proportional to the mean polarization of the ensemble at the start of the pulse sequence. The randomness is only apparent, and is in any case induced by the well-defined coherent incident irradiation. It is a determinate response of the system; it is not noise.

One of the noise sources in NMR measurements is spin noise, the intrinsic quantum statistical uncertainty in the measurement of an observable of a spin system (e.g., its magnetization). The theoretical existence of spin noise in magnetic resonance measurements is well known. In its simplest guise it is a microscopic analog of the statistics of flipping coins, with the two orthogonal quantum states of a spin $I=½$ playing the role of heads and tails. The mean polarization P of the ensemble ($-1<P<1$) plays the role of bias in the coin, with $P=0$ being the unbiased case. It is the mean value observed in first-order measurements of the magnetization normalized by dividing through by the spin quantum number I, proportional to the magnetic moment per spin, and the number of spins N. The quantities P and N fully specify the most accessible type of spin ensemble, that described as independent spin paramagnetism, which is a good approximation to the spin ordering obtained by equilibration when the interaction of each spin with the a magnetic field is much stronger than the interactions between spins and at temperatures T where kT (with k the Boltzmann constant) is much greater than the energy of these interactions. The variance in P is the spin noise and has been recognized as a theoretical limit to the sensitivity of magnetic resonance, although it is not clear that it has ever yet been the dominant noise in any practical attempt at obtaining a magnetic resonance spectrum. There have been some theoretical efforts to imagine ways of preparing an ensemble of spins in such a way that a first order measurement of P would have a smaller variance than that for an ensemble characterized by independent spin paramagnetism.

Many known magnetic resonance spectroscopy experiments use first-order measurements of such spin polarization as a function of time or of the frequency of perturbing irradiation. The most notable exception is the experimental demonstration of spin noise in steady-state observations of rf magnetization. In these experiments, the zero-field spectrum was obtained as a contribution to the noise in the SQUID-detected flux through a pickup coil near the sample. This spectrum was thus a power spectrum of the spontaneous fluctuations of the magnetization with no applied radiation and thus is an example, in the frequency domain, of a second-order correlation function.

A reported observation of the ESR of a single spin as a peak in the power spectrum of the radio-frequency current between a surface and an STM tip may be another analogous example. See, Manassen et al., Phys. Rev. Lett. 62 (1989) p. 2531. The sensitivity for this steady-state, second-order approach has been quantitatively analyzed for detection by magnetic induction. Sleator et al. (1987). "Nuclear-Spin Noise and Spontaneous Emission." *Physical Review B Condensed Matter* 36: 1969–1980. The signal is the power spectrum of the fluctuations of that rf component of magnetization which couples to the detector. For the hypothetical case of a system with a sufficiently long spin-lattice relaxation time it has been argued that such an essentially noninvasive steady-state observation could be the preferred method of observation. It may not have been the preferred method in any realized situation.

The present technique also uses the spin noise as part of the signal in the limit where P is negligible relative to its own fluctuations. However, the present invention has no application to the experimental paradigm of measuring a spectrum solely by way of the contribution of the steady-state spin noise to the frequency domain power spectrum of the observable. Rather it is aimed at the wider class of time-domain spectroscopic methods. It avoids steady-state by design and is indeed most useful when an entire repetition of the experiment can be performed in a time short compared to that at which the spin system reaches steady state by virtue of its interaction with the environment and detector.

The present technique can be applied to measurements in force-detected magnetic resonance (FDMR). Conventional force-detected NMR techniques require an entanglement between the trajectories of individual molecules and their internal states throughout the experiment. The interaction between a laboratory field gradient and a permanent or transition dipole of the molecule of interest is used to encode spectroscopic information on the molecular trajectory, which is then measured. The ability of these conventional methods to provide spectroscopic resolution depends on the essentially collisionless nature of these trajectories. This usually limits their use to molecular beams and dilute trapped phases. In addition, the spectral resolution is often limited by time-of-flight through the apparatus or by the molecular collision time. This is in contrast to the more desirable situation of a high resolution-spectroscopy in which the achievable spectral linewidth is limited only by the lifetime or dephasing of the superpositions of internal states. In common with second-order methods, these force-detected methods, acting on single molecules with entangled trajectories, do not require any population differences (e.g., mean spin polarization P) between the states connected by the resonant irradiation. The entanglement allows this to be achieved despite there being a single measured quantity in these examples, for example the flux of molecules at a detector which terminates the trajectory. The present technique does not require such entanglement and therefore can be advantageously used to measure NMR signals. Force-detected NMR methods can be used for ion spectroscopy in which the measurement of a trapped ion frequency before and after a period of spectroscopic evolution provides the information necessary to determine spectroscopic transition probabilities in an intermediate evolution period. See, Pizarro and Weitekamp (1992). *Bull. Magn. Reson.* 14: 220 and U.S. Pat. No. 4,982,088. These are second-order time-domain spectroscopic experiments which require that the members of the spectroscopic ensemble (e.g., molecules) be distinguished from one another during any part of the experiment by measurably different trajectories. The present technique can be advantageously applied in such ion spectroscopic measurements for measuring states of matter where the molecules are rapidly colliding (e.g., fluids) or are strongly coupled in their motions (e.g., solids). This is because it is not required to have any degree of freedom with which the target observable need remain entangled over that period of the experiment which determines the spectroscopic resolution.

The present technique may also be applied to forced-detected NMR measurements in which a sample is placed in a magnetic gradient field rather than a homogeneous field as in the previous examples. Such NMR systems and methods are disclosed by, for example, Sidles et al., "Magnetic-Resonance Force Microscopy." *Reviews Of Modern Physics* 67: 249–265(1995); Rugar et al., "Force Detection Of Nuclear-Magnetic-Resonance." *Science* 264: 1560–1563 (1994). A common feature is that the spin magnetization is modulated so as to drive a mechanical harmonic oscillator to which it is coupled through magnetic forces. In the method of magnetic resonance force microscopy (MRFM). See, Sidles, 1995. The spin density of a sample in a large magnetic field gradient is imaged by successively bringing different regions (sensitive slices) of the sample into Larmor-frequency resonance with an rf magnetic field which is repeatedly swept through resonance so as to invert the longitudinal magnetization near the audio frequency of the harmonic oscillator. Either the sample or the ferromagnetic particle providing the field gradient can be the harmonically moving part. This method has been implemented by using conventional first-order correlation measurements, nominally measuring the mean net polarization NP of each sensitive slice. It has been proposed that this method is extensible to the imaging of individual electron and nuclear spins, and it was recognized that such a measurement would not depend on the average spin polarization. Many of the instrumental requirements for such experiments have been detailed, and quantitative estimates of the anticipated signal-to-noise ratio (SNR) have been made that do not include spin noise and are dominated by Brownian motion of the mechanical oscillator. See, Sidles, J. A. and D. Rugar (1993). "Signal-to-Noise Ratios In Inductive and Mechanical Detection Of Magnetic-Resonance." *Physical Review Letters* 70: 3506–3509. Omission of the spin noise contribution to the total noise limits the applicability of such SNR estimates to the case where exactly one spin (or none) interacts substantially with the measurement apparatus.

Such limitations can be mitigated by using the present technique. Setting aside the difficulties of arranging for this to be the case, if it were achieved then the MRFM experiment would provide one bit of information on each repetition; either the spin is present in the sensitive slice or it is not. This type of experiment can be viewed as a special case of a second-order correlation function in which the two factors are a single measurement whose value is squared. Were such prior art methods of MRFM to be applied to sensitive slices with $P(N)^{1/2} \ll 1$, but $N>1$, spin noise would dominate instrumental noise and previous (Brownian) SNR estimates would not apply. The present invention includes strategies for making more practical the generalization of MRFM to such sensitive slices containing arbitrary numbers of spins. Spin noise is an important consideration in the optimization of the method and in the resulting SNR. A qualitatively different analysis is needed and provided herein, indicating the limitations of the prior art MRFM methods and conception. The analysis also includes second-order adaptations of imaging methods such as Fourier zeugmatography and back-projection, which are advantageous, but incompatible with MRFM apparatus.

A major limitation of MRFM apparatus as a magnetic resonance spectrometer is that there is a large field gradient at the sample. Magnetic resonance spectroscopy may be contrasted with magnetic imaging methods as being those experiments in which the frequencies of spin evolution to be determined are dominated by parameters (chemical shifts, spin-spin couplings, quadrupole interactions) other than the location of the spin along the field gradient. Indeed the vast majority of magnetic resonance methods require the minimization of the field gradient during all or part of the experiment. Although low resolution solid-state spectroscopic information has been obtained with MRFM apparatus, this necessitates a magnetic field gradient far below that which is optimal for sensitivity. In such an apparatus, sensitivity is proportional to the static field gradient across the sample. A more extended discussion of the disadvantages of the static field gradient of the MRFM method has been given. An additional problem worth noting is that the presence of the field gradient makes the resonance frequency such a strong function of molecular position that applications to fluids would suffer from severe loss of signal related to the short residence time of the spin-bearing molecule in the sensitive slice of a gradient large enough to offer a sensitivity advantage over inductive detection methods.

The BOOMERANG method of force-detected NMR uses a homogeneous static field at the sample to obviate the problems in other force-detected NMR methods and is especially advantageous in achieving higher SNR for small samples. In the BOOMERANG apparatus and method, the sensitivity and resolution are essentially independent, and both can generally be made better by orders of magnitude than in MRFM. A combination of the BOOMERANG method and the present technique can be used to fully utilize the advantages of both BOOMERANG and the present technique.

Figure 9A:
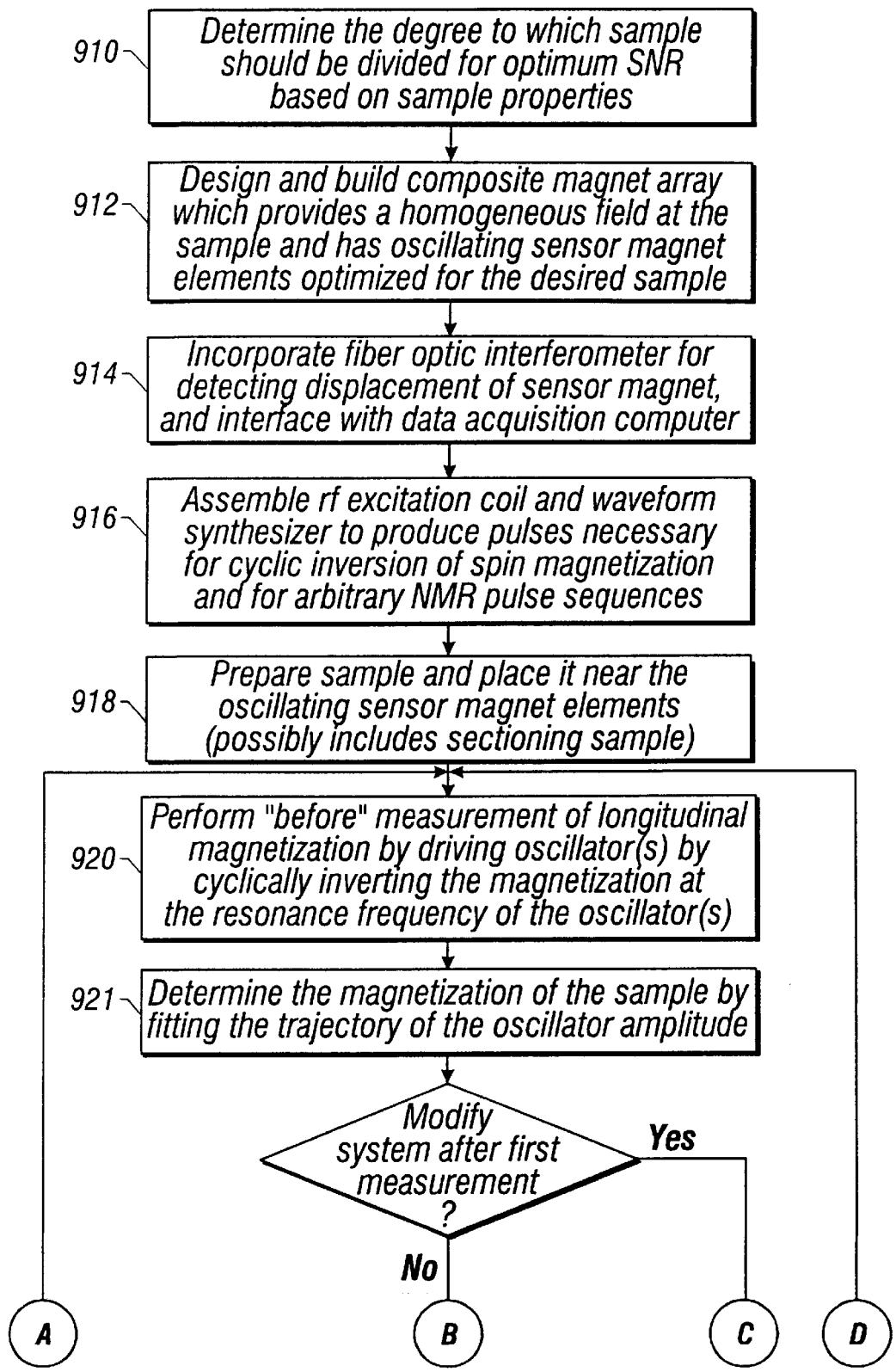
FIGS. 9A and 9B are flow charts for one operation process in implementing the present technique using the BOOMERANG scheme for force-detection of NMR.
Figure 9B:
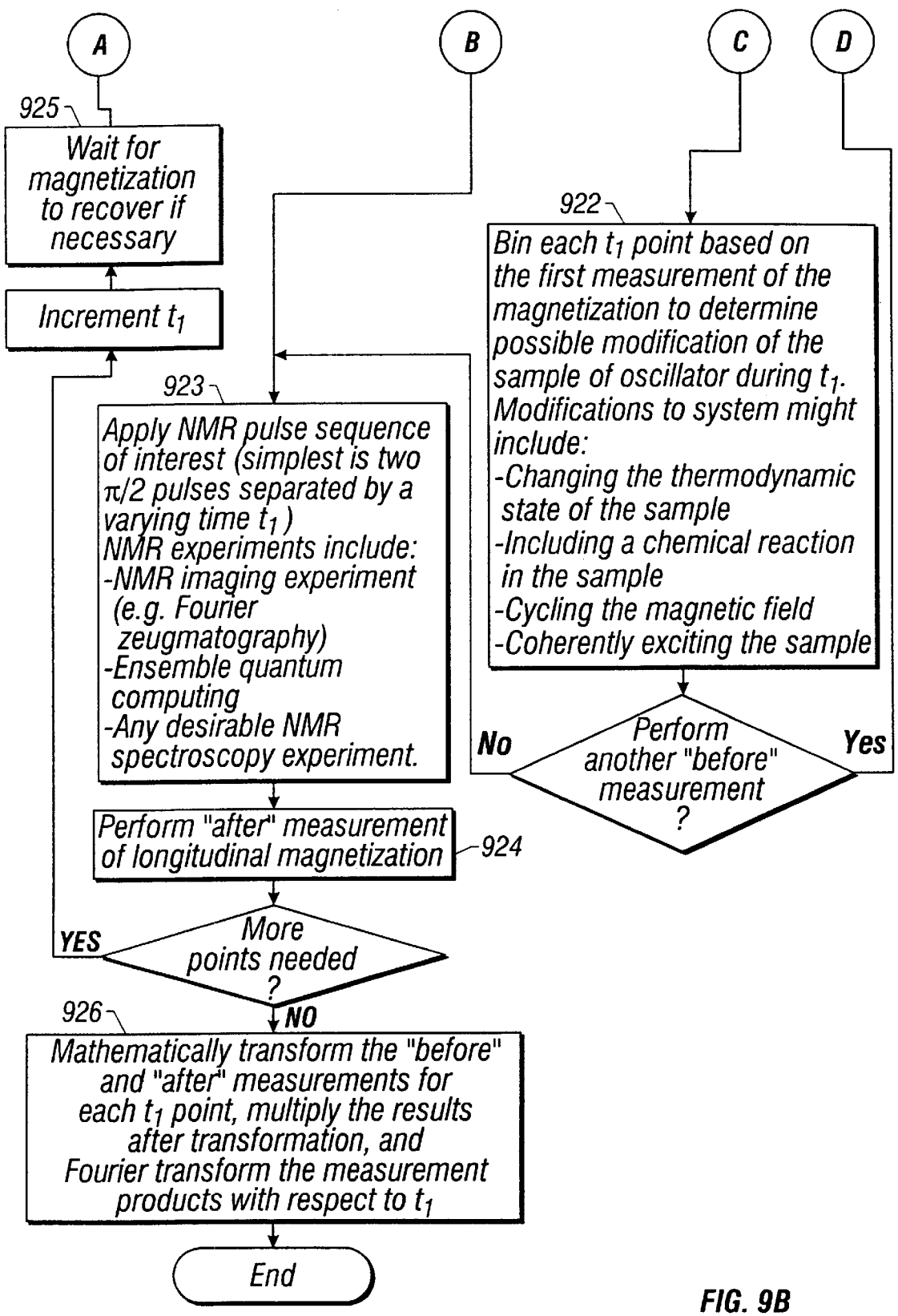

FIGS. 9A and 9B are flow charts for an operation process in implementing the present technique using the BOOMERANG scheme for force-detection of NMR. The process may be divided into two parts: (1) preparation of sample and detection hardware; and (2) performing measurements and processing data using the present technique.

FIG. 9A depicts the operation steps in preparing a BOOMERANG experiment. Certain details of these steps are disclosed in the incorporated references, U.S. patent application Ser. No. 08/872,528 and Leskowitz et al., "Force-detected magnetic resonance without field gradients," Solid-State Nuclear Magnetic Resonance, Vol. 11(1,2), pp. 73–86 (1998). For a given sample, it may be desirable to divide a sample into multiple pieces and use different detectors to measure different pieces. This can improve the detection sensitivity and increase the SNR This is shown by step 910. Next, in steps 912–918, a composite magnet array, one or more oscillation sensors and other components are designed for a BOOMERANG apparatus to accommodate the sample.

FIG. 9B is a flowchart for carrying out measurements and processing data using the present technique based on the BOOMERANG apparatus to obtain NMR spectra, NMR images, quantum computations, or other quantities of interest. At step 920, a "before" measurement is performed to measure the first response associated with the longitudinal magnetization of the sample. At step 921, the magnetization of the sample is determined. Next at step 923, an NMR pulse sequence is applied to the sample to allow the spins to evolve for obtaining spectroscopic measurements, NMR imaging, quantum computing and other effects. It may be necessary to further prepare the sample prior to the step 922. Such additional processing step is illustrated by the step 922 in which one or more "before" measurements may be performed. After step 923, an "after" measurement is performed to obtain a second response from the sample on the longitudinal magnetization (step 924). If additional data points are needed, step 925 is carried out to allow the sample to recover in a "waiting period" and then steps 920–924 are repeated. Otherwise, at step 926, the "before" and "after" measurements are transformed to form desired correlation functions which are Fourier transformed for data extraction. More specifically, the measured time-domain transients are encoded pointwise by taking time-correlated measurements with a varying time $t_1$ in the evolution period (i.e., the third epoch in FIG. 1A) of the experiment and Fourier-transforming with respect to $t_1$.

Another experimental choice, which takes on special importance in the case where the initial condition noise is dominant, is the fraction of possible observables which are included in a particular observation. In first-order spectroscopic experiments, the SNR is ideally not affected by whether the observation made includes many spectral lines or only those of actual interest. This is because the noise relevant to a particular line is that which overlaps it in frequency and under typical conditions this is either additive in nature (e.g. thermal noise in the detector) or is associated with the transition (e.g. photon counting uncertainty intrinsic to that line). We define pointwise methods as those in which the spectrum is obtained as a Fourier transform with respect to an evolution period time variable $t_1$ which is not also the detection time variable. In pointwise methods, the absence of correlation in noise between successive points in $t_1$ guarantees that the noise in this conjugate frequency variable is "white," or frequency independent. Thus, if the noise includes uncertainty due to fluctuations of the signal itself, as distinct from additive noise from the detection process, then there is a motivation to limit the signal to that which is advantageous [Weitekamp, 1983 #4] and to suppress that signal which is of no interest, but which would otherwise serve to contribute additional white noise. This noise is known as $t_1$ noise and is ascribable in NMR to instrumental instability. A similar strategy is at play when difference experiments are used to isolate the effect of some experimental manipulation and when solvent lines are suppressed. Methods that can be used to minimize this problem by limiting the signals to those of interest are filters, frequency selective pulses, nk-quantum selective, differential relaxation times, and inhomogeneous magnetic fields arranged to dephase unwanted contributions. The present technique can be combined with any of these techniques to improve the SNR of the measurements. The difference is that the present technique uniquely addresses the problem of fluctuations of signal that lead to noise which is intrinsic to the system, as opposed to being amenable to amelioration by improving the stability of the experimental manipulations.

Yet another application of the present technique is quantum computing. A general computer may be regarded as a device that transforms input information into output information. Other operations performed by physical computing devices, such as rendering screen displays or printed pages, may be viewed as side effects of the "computing" or information-transforming process, and these side effects are irrelevant for the present discussion. In an ordinary, "classical" digital computer, information takes the form of a string of bits, each of which may assume one of the values 0 or 1. In contrast, a quantum computer processes quantum information in the form of qubits (quantum bits), each of which may be in a continuous linear combination, or superposition, of two states that may be defined as 0 and 1. The correspondence with the quantum mechanical two-level system is particularly useful here, and physical manifestations of simple prior-art quantum computers and proposals for quantum computers are based on interacting two-level systems (e.g., spins or pairs of atomic electronic states). See, Monroe et al., Phys. Rev. Lett. 75 (1995) p. 4714 and Lloyd, Science 261, (1993) 1569.

Interest in quantum computers surged when discovered a quantum computing algorithm for factoring integers that operates in a time that scales as a polynomial in L, the number of bits of input. Shor, in Proceedings of the 35th Annual Symposium on the Foundations of Computer Science, (IEEE Computer Society, Los Alamitos, 1992), p. 124. The factoring of large integers is an area of intense research, largely because of its connection to cryptography, but the best known algorithms that can be run on classical computers require computing times proportional to $\exp(L^{1/3})$. The power of quantum computing algorithms lies in their use of input states that are superpositions of the ordinary 0 and 1 states of classical computers. A suitably designed quantum computation on a superpositional input state may be viewed as a parallel computation on all possible input states. This parallelism is a key feature of quantum algorithms, and it allows polynomial-time computation where the best known classical computations require exponential time. There are at present few known quantum algorithms. See, Shor, supra.; Grover, Phys. Rev. Lett. 79 (1997) p 325; and Brassard, Science 275, (1997) p 627.

Quantum computers may be implemented by using individual two-level atoms as the qubits. A useful development in the field has been the introduction of ensemble quantum computing, in which "pseudo-pure" states of macroscopic systems serve as the qubits. See, e.g., Gershenfeld et al., Phys. Comp. 96, Proc. Of the Fourth Workshop on Physics and Computation, 1996, p. 134. These states are preparations of a macroscopic system's density operator that obey the same dynamics as states of a single microscopic system. Pseudo-pure states of, for example, nuclear spins in liquids have some advantages over single-atom states, namely that they are more robust to decoherence and are experimentally easier to prepare and manipulate. Simple quantum gates have been demonstrated in multiple-pulse NMR experiments with liquid samples at room temperature. Recent work has shown that a "universal quantum computer" is reducible in theory to suitably designed NMR experiments on suitably designed spin systems. Thus, one can in theory reduce doing arbitrary quantum computations to doing NMR experiments.

Spin noise has been identified as a major challenge to be overcome in making ensemble quantum computing with NMR useful. See, Warren, "The Usefulness Of Nmr Quantum Computing." *Science* 277: 1688–1689(1997). The main problem is that, in the regime where quantum computing might be superior to readily available classical computing, preparation of the required initial states is very inefficient For example, in a computation requiring 100 qubits, the possible number of states for this system is $2^{100} \cong 10^{30}$, and hence in a kilogram sample of $\sim 10^{24}$ molecules, a given initial state is usually unpopulated. This uncertainty in the initial condition is an aspect of the spin noise that is addressed by the present invention. By measuring the second-order correlation function of the magnetization, use is made of an arbitrary initial condition, and each shot of the experiment contributes to the signal. Many published ensemble quantum computing methods are described in terms of the first-order NMR signal.

The present technique has been shown to enable the conversion of arbitrary multiple-pulse NMR experiments from first order experiments to second order experiments. Here we include all those NMR experiments for quantum computation.

One procedure for converting quantum-computing NMR experiments to the second-order measurement methods of the present technique is as follows. NMR methods for quantum computing rely on detection of precessing transverse magnetization. The relevant quantum-mechanical expression for the first-order signal, in the representation in which the initial density operator $(\rho(0)=1+bI_x)$ is taken to be that of the system after a preparatory $\pi/2$ pulse, is $$S(t,\alpha)=\langle I_+(t,\alpha)\rangle=Tr\{\rho(0)I_+(t,\alpha)\}=bTr\{I_xI_+(t,\alpha)\}.$$

The parameter b represents the polarization of the spin system, and a represents all other parameters (usually time periods and pulse phases) that characterize the evolution imposed on the system by the experimenter. To increase sensitivity, the same information that is available from this experiment may be obtained pointwise in a BOOMERANG experiment, where $\rho(0)=1+bI_z$ and the observable is $I_z$:

$$S_B(t_1,\alpha)=<I_z(t_1,\alpha)>=Tr\{\rho(0)I_z(t_1,\alpha)\}=bTr\{I_zI_z(t_1,\alpha)\}.$$

Note that the "dimension" of the experiment is increased by one in this step. The experiment is now in a form suitable for measurement of the second-order correlation function. A measurement of $I_z$ is inserted prior to the period $t_1$, and the signal is defined as $$S_2(t_1,\alpha)=<I_z(0)I_z(t_1,\alpha)>=Tr\{\rho(0)I_zI_z(t_1,\alpha)\}=Tr\{I_zI_z(t_1,\alpha)\}.$$

Note that these expressions are identical to within a proportionality constant. The terms linear in b and of higher order in b have been dropped from the expression for the signal, for the method works even with unpolarized samples for which $$\rho(0)=1+bI_z\approx 1.$$

These terms could be retained, as they were in the exact calculations illustrating the sensitivity of second-order BOOMERANG, but the principle value of the second-order measurement may be when the terms are small, which is the regime where the present invention can have a large sensitivity advantage over first-order methods.

The measurement of the second-order correlation function in this method allows measurement of $I_z$ with approximately unit SNR per root shot. For some quantum computing applications, very high order multiple-quantum coherences may be the target observables, and there will necessarily be reduction in signal in the preparation of these coherences and in their conversion to observable magnetization. In any case, there is advantage to be gained by performing measurements simultaneously on as great a number of identically prepared small systems as is practical. Because of the small dependence of the second order SNR on the number of spins, the present method enables the complex spectroscopy needed for quantum computing to be done down to the single molecule level. Indeed, the limiting case is each target molecule being observed by multiple detectors. In principle, the best SNR would be obtained by coadding the signals from N molecules with the measurement periods no longer than needed to make instrument noise negligible with respect to spin noise. This ideal is approached by taking a macroscopic sample and dividing it among a large number of miniature spectrometers prepared perhaps by microfabrication techniques. The sensitivity will increase as the square root of the number of molecules. This procedure may also be used to advantage in non-quantum-computing NMR experiments where the sample may be so divided.

While the above approach is a compelling strategy that is readily related to established first-order methods, it is not necessarily sufficient for a given spectroscopic or quantum computing application, particularly as the number of qubits becomes high. Here it is anticipated that binning the second-order products according to the values of the "before" and/or "after" measurements will also be useful. This allows preparation and detection of high-order multiple-quantum coherence in a manner that is essentially independent of the couplings between spins. These superpositions of states play a key role in quantum computing algorithms, but traditional routes to their observation are impractical for the numbers of coupled spins that are needed for presently conceived quantum computing algorithms. Note that the second-order concept is valuable when the system cannot for practical reasons be prepared in a pure state. When the number of distinguishable spin states is as high as is envisioned in the quantum-computing literature, this will be the case even as P approaches unity. Thus it is expected that the present invention will also be useful in situations of high, but imperfect spin polarization.

A second measurement problem which can be substantially eliminated using techniques that are completely compatible with the present method is that of the distortion of the desired information about the measured system by the "back action" of the measurement apparatus on that system. The principal problem caused by the interaction is a shortened decay time for a superposition of states whose Bohr frequency or intrinsic decoherence time is thereby obscured. A related problem is that of "frequency pulling", where the observed frequencies are not that of the system alone, but of the system as coupled to the measurement apparatus. Such back action is well known both in the case of systems whose states span a finite Hilbert space (e.g., the phenomenon of "radiation damping" in NMR) and those which are well characterized by nominally infinite Hilbert spaces (e.g., harmonic oscillators). In a few cases, methods have been described which partially address this problem. In the case of NMR, this includes active suppression of the feedback of spin-induced rf fields in the sample inductor. In the field of trapped ion physics, measurement schemes have been demonstrated in which the interaction with the detector is subsequent to an evolution period during which the ion motion of interest is substantially undamped. See, Cornell et al., Phys. Rev. A 41 (1990) p. 312; and Phys. Rev. Lett. 63, (1989) 1674. A related issue is the considerable theoretical literature on "quantum non-demolition" (QND) measurements. Braginsky and Khalili, *Quantum Measurement*, Cambridge, Cambridge University Press (1992). This theory gives a recipe for finding that subset of observables whose repeated or continuous measurement can lead to accuracy which is not, in principle, limited by the Heisenberg uncertainty principle.

The present method enables the adaptation of the above technique to second-order measurements and in particular to those which have the time line of FIG. 1A. In general, the present method allows for the absence of back action during the generalized evolution period. When such back action would otherwise be problematic, the method allows for the decoupling of the measurement apparatus from the system under test during this period. Such decoupling can be achieved by known means which can reduce back action to a negligible problem. These include altering the resonance frequency of the detector from that which would be optimum during measurement, broadening the resonance of the detector, or introducing shielding or physical distance or altered orientations between the sample and the detector.

The present method also allows for the indirect second-order measurement of observables for which no instrument is practical or available. This includes the creation of so-called "forbidden" or disallowed spectroscopic superpositions, such as those involved in multiple-quantum coherence. The present method provides a second-order means for measuring their time evolution. In general, these superpositions will not be detectable in a second-order analysis of a continuously measured allowed observable. Rather, the time line of FIG. 1A is essential. It is simply necessary to provide, as part of the generalized evolution period, a preparation period at the beginning to convert the density operator following the "before" measurement to the desired (forbidden) operator and a mixing period at the end (after a period of evolution) to convert the evolved operator to the observable relevant for the "after" measurement.

We note that the prescription for QND observables includes (in principle, though perhaps not in known examples) forbidden QND observables. These can be observed by the same procedure, with a judicious choice of the QND observable (forbidden or not).

Another application of the present invention is the characterization of systems of oscillators. Some physical examples such as trapped ions, phonons, the electromagnetic field, and microfabricated mechanical and electronic devices are normally described as harmonic oscillators. Varying degrees of anharmonicity are normally present and may be part of the information of interest. Examples with notable anharmonicity are vibrational states of molecules and electronic states.

Recall from the example of spin noise that initial condition noise begins to dominate the ordinary first-order signal when the distribution of total spin angular momentum in the initial condition significantly overlaps with zero, leading to an increasing number of measurements in the signal average (ergodic ensemble average) whose sign is opposite to the sign of the average. The second-order multiplication scheme corrects for this sign fluctuation and converts repetitions of the experiment from destructive to constructive contributors to the signal average.

An analogous initial condition for the quantum-mechanical harmonic oscillator is the thermal equilibrium density operator, whose average energy fluctuations are equal in magnitude (~kT) to the average energy, and whose phase distribution is totally random. In contrast to spin systems (for which the Hilbert space is bounded), with harmonic oscillators it is often practical to obtain a large first-order signal simply by coherently driving the oscillator from its thermal equilibrium initial condition to an amplitude much larger than the unamplified thermal fluctuations. The first-order signal is then measured and, perhaps, Fourier analyzed. However, in some applications it may be impossible or impractical to drive the initial condition to an amplitude significantly greater than the thermal distribution. The sample may be sufficiently remote from or inaccessible to a driving field, in which case the distribution of "before" measurements alone will have significant overlap with zero. In either case, the initial condition noise may dominate the signal, requiring the use of the proposed second-order techniques in order to achieve superior SNR.

A similar situation is the case where one would like to characterize a system secretly. The minimally invasive second-order approach consists in this case of coupling to the system under test only during the measurement period and for only as long as needed for an acceptable measurement. This reduces the chance of the measurement being detected, while not compromising the spectral resolution of the measurement, which is determined by the length of the generalized evolution period, during which no measurement is made. Minimal perturbation of the target is desirable in espionage applications.

Another related case is where exciting the system to large amplitudes would be undesirable or dangerous due to sample heating or where the system is easily driven into inelastic regions that would cause irreversible damage. Even where permanent damage would not be caused to the system, in some cases a large coherent excitation would drive the system into nonlinear response. A large-amplitude method would therefore degrade the measurement of "small-signal" properties of the system relative to a measurement with very weak perturbations introduced in the coherent evolution period. This may be a prime concern in "nanoelectronics" applications. In all of these cases, the optimal excitation, measurement, and/or evolution schemes may be incorporated into the present second-order method.

A related situation, perhaps the most important application in the context of "minimally invasive measurements," is for systems where the back-action from the measuring apparatus significantly changes the system of interest. In that case, it is desirable to provide for the system a period $t_1$ during which the system evolves in the absence of interaction with the detection apparatus or with a thermal bath through the intermediary of the detection apparatus. The evolution thus proceeds in the system's "natural state," free of damping, "frequency-pulling," or nonlinearities induced by the detector. The sensitivity of second-order measurements in which the detection apparatus is decoupled from the system during the evolution period may exceed that of analogous first-order procedures, and both the sensitivity and resolution may exceed that of continuous-measurement procedures analyzed with second-order correlation functions. Another example of the application of the present technique is the analysis of the thermal fluctuations of stationary systems. See, Nyquist, H. (1928). *Physical Review* 32: 110 and McCombie, C. W. (1953). *Rep. Prog. Phys.* 16: 266. By observing the system, ideally with negligible perturbation by the measurement apparatus, and performing spectral analysis of various second-order correlation functions, it is possible to learn about the characteristic frequencies and relaxation (damping) times of the system. In most laboratory situations this is not the preferred approach because the fluctuations of a system in a stationary state are typically smaller than those that could be transiently induced by an intentional perturbation. While one could in principle determine that a piano is out of tune without touching it, by simply listening to its thermal fluctuations, it is preferable from the viewpoint of sensitivity to play it and spectrally analyze the resulting coherent response. This latter approach is an example of a first-order correlation function. First-order correlation functions provide much of the same information about the system as the second-order correlation functions. They can be averaged over repetitions if desired. However, when coherent responses of such a system are comparable to or less than the fluctuations of the stationary state, measurement based on the second-order correlation functions of the present technique becomes important.

The present technique can be applied to obtain second and higher order correlation functions of the intensities of electromagnetic fields. In a quantum mechanical description, the measured quantities are the positive-definite expectation values of the photon number operators of the quantized field, as distinct from the raising and lowering operators whose complex expectation values correspond to the field amplitudes. Operationally, the second order correlation function of a field has the form of $<S_2>$ with the quantities $S_b(q_b, t_b)$ and $S_a(q_a, t_a)$ being, for example, photocurrents in two detectors or the same detector at different times. Thus it is a measure of photon coincidences. A principal application of such observations is second-order interferometry, for example in astronomy. Another application of second and higher order correlation functions of photon number operators is the characterization of nonclassical states of electromagnetic fields. Another area of application is the optical spectroscopy of dilute molecules. Orrit et al., "Optical spectroscopy of single molecules in solids" in *Progress in Optics,* Vol. XV, pp. 61–144, (1996).

Although the present invention has been described in detail with reference to the preferred embodiments, various modifications and enhancements may be made without departing from the spirit and scope of the invention as defined by the following claims.

What is claimed is:

1. A measuring method, comprising:
   performing a measurement operation on at least a portion of a system that has a memory, the measurement operation including measuring a property of the system during a first measurement period to produce a first response indicative of a first state of the system, and measuring the property of the system during a second measurement period to produce a second response indicative of a second state of the system, after an evolution duration subsequent to the first measurement period when the system still retains a degree of memory of an aspect of the first state;
   combining a first function of the first response with a second function of the second response to form a second-order correlation function; and
   extracting information about the system from the second-order correlation function.

2. A method as in claim 1, wherein the first and second functions are respectively the first and second responses.

3. A method as in claim 1, wherein the second-order correlation function includes at least a product of the first and second functions.

4. A method as in claim 1, wherein the correlation function is configured to increase a signal-to-noise ratio in extracting the information about the system.

5. A method as in claim 1, wherein the first function is an inverse of the first response and the second function is the second response, and wherein the second-order correlation function includes a term of the second response divided by the first response.

6. A method as in claim 1, wherein the first function includes a function of $$f_b(I_z) = \frac{1}{\frac{\zeta}{I_z} + \frac{I_z}{\zeta}} = \frac{\zeta I_z}{\zeta^2 + I_z^2},$$

where $\zeta$ is a scaling parameter and $I$ represents the first response.

7. A method as in claim 6, wherein the measurement operation further comprises selecting the scaling parameter to be associated with a function of a uncertainty caused by noise.

8. A method as in claim 7, wherein the noise includes instrument noise.

9. A method as in claim 7, wherein the noise includes quantum noise.

10. A method as in claim 9, wherein the scaling parameter is of the same order of magnitude as a quantum uncertainty in the first response when quantum noise dominates the noise.

11. A method as in claim 7, wherein the function depends on uncertainties due to both quantum uncertainty and instrument noise.

12. A method as in claim 11, wherein the function is related to root-mean-square sum of the quantum uncertainty and the instrument noise.

13. A method as in claim 1, further comprising applying a perturbation to change a state of the system before or during said evolution period.

14. A method as in claim 13, wherein the state of the system includes a thermodynamic state.

15. A method as in claim 13, wherein the state of the system includes quantum state.

16. A method as in claim 13, wherein the perturbation includes a chemical reaction.

17. A method as in claim 13, wherein the perturbation includes changing a magnetic field applied to the system.

18. A method as in claim 13, wherein the perturbation includes coherently exciting the system.

19. A method as in claim 13, wherein the perturbation includes coherently de-exciting the system.

20. A method as in claim 13, wherein the perturbation includes coherently altering the system.

21. A method as in claim 13, wherein the system includes particles with non-zero magnetic moments, and wherein changing the state of the system includes applying at least one electromagnetic pulse to alter a property of the magnetic moments.

22. A method as in claim 1, wherein the measurement operation further comprises isolating the system from external perturbation during said evolution period.

23. A method as in claim 1, wherein the measurement operation further comprises applying an initial perturbation to configure the system in a desired initial state prior to the first measurement.

24. A method as in claim 1, wherein the measurement operation further comprises measuring the property of the system during at least a third period to produce a third response indicative of a third state of the system, after another evolution duration subsequent to the second measurement when the system still retains a degree of memory of an aspect of the second state.

25. A method as in claim 24, further comprising: combining the first function of the first response, the second function of the second response, and at least a third function of the at least third response to form a correlation function of at least third order; and extracting the information about the system from the correlation function of at least third order.

26. A method as in claim 24, further comprising combining the second function of the second response and the third function of the third response to form another second-order correlation function for extracting the information about the system.

27. A method as in claim 26, further comprising:
   averaging the second-order correlation function and the other second-order correlation function to produce an averaged second-order correlation function; and
   extracting information about the system from the averaged second-order correlation function.

28. A method as in claim i, further comprising repeating the measurement operation for a plurality of times.

29. A method as in claim 28, further comprising: forming a second-order correlation function from the first and second functions of each measurement operation;
   averaging at least part of the second-order correlation functions of the repetitive measurement operations to produce an averaged second-order correlation function; and
   extracting the information about the system from the averaged second-order correlation function.

30. A method as in claim 29, wherein a given repetition is selected for inclusion in the averaged second-order correlation function according to the outcome of at least one of the first and second responses for that repetition.

31. A method as in claim 29, wherein a given repetition is selected for inclusion in the averaged second-order correlation function according to the correlation outcome for the repetition.

32. A method as in claim 28, further comprising:
averaging at least part of the first functions from the repetitive measurement operations to produce an averaged first function;
averaging at least part of the second functions from the repetitive measurement operations to produce an averaged second function; and
correlating the averaged first function and the averaged second function to extract the information about the system.

33. A method as in claim 1, wherein the measurement operation further comprises measuring the property of the system at least twice during at least one of the first and second measurement periods to produce at least two measurements of the property.

34. A method as in claim 1, wherein the measurement operation further comprises measuring at least another property of the system during at least one of the first and second measurement periods.

35. A method as in claim 1, wherein the system includes a plurality of portions, and the measurement operation is performed on only one or more selected portions of the system and not on all portions of the system.

36. A method as in claim 1, wherein the system includes an ensemble of particles.

37. A method as in claim 1, wherein the system includes a single particle.

38. A method as in claim 1, wherein the measurement operation is performed by using a single detector.

39. A method as in claim 38, wherein the system includes a plurality of portions, and wherein the measurement operation comprises:
using the detector to measure a first portion of the system; and
using the detector to measure a second portion of the system that is different from the first portion.

40. A method as in claim 38, wherein the detector is decoupled from the system during the evolution duration.

41. A method as in claim 38, wherein the measurement operation includes changing at least one parameter of the detector before or during the evolution duration.

42. A method as in claim 41, wherein the at least one parameter includes a resonance frequency.

43. A method as in claim 41, wherein the at least one parameter includes a width of a resonance.

44. A method as in claim 38, wherein the measurement operation further comprises changing at least a relation of the detector with respect to the system before or during the evolution duration.

45. A method as in claim 44, wherein the relation includes a distance or an orientation of the detector relative to the system.

46. A method as in claim 38, wherein the measurement operation further comprises:
setting at least one parameter of the detector at a first value during the first measurement period; and
setting the at least one parameter of the detector at a second value that is different from the first value during the second measurement period.

47. A method as in claim 1, wherein the measurement operation is performed by using at least two detectors.

48. A method as in claim 47, wherein the at least two detectors are coupled to one another.

49. A method as in claim 47, wherein the at least two detectors are not coupled to one another.

50. A method as in claim 47, wherein the measurement operation is performed by using at least a third detector, and wherein the at least two detectors are coupled to each other while the third detector is not coupled to either of the at least two detectors.

51. A method as in claim 47, wherein the system includes a plurality of portions, and wherein the measurement operation comprises:
using one of the at least two detectors to measure a first portion of the system; and
using another of the at least two detectors to measure a second portion of the system that is different from the first portion.

52. A method as in claim 47, wherein at least one of the at least two detectors is decoupled from the system during the evolution duration.

53. A method as in claim 47, wherein the measurement operation further comprises changing at least one parameter of at least one detector before or during the evolution duration.

54. A method as in claim 53, wherein the at least one parameter includes a resonance frequency.

55. A method as in claim 53, wherein the at least one parameter includes a width of a resonance.

56. A method as in claim 47, wherein the measurement operation further comprises changing at least a relation of at least one detector with respect to the system before or during the evolution duration.

57. A method as in claim 56, wherein the relation includes a distance or an orientation of the detector relative to the system.

58. A method as in claim 47, wherein the measurement operation further comprises:
setting at least one parameter of at least one detector at a first value during the first measurement period; and
setting the at least one parameter of the at least one detector at a second value that is different from the first value during the second measurement period.

59. A method as in claim 1, wherein at least one function of the first and second functions includes at least one Fourier component of a response associated with the at least one function.

60. A method as in claim 1, wherein at least one of the states include quantum states.

61. A method as in claim 1, wherein at least one of the states include thermodynamic states.

62. A method as in claim 1, further comprising changing a quantum property of the system to implement a quantum computing operation.

63. A method as in claim 62, wherein the quantum property is changed during the evolution period.

64. A method as in claim 62, wherein the quantum computing operation is associated with a cryptography operation.

65. A method as in claim 1, further comprising decoupling one portion of the system from another portion of the system.

66. A method as in claim 64, wherein the decoupling is performed during the evolution period.

67. A method as in claim 65, wherein the decoupling is performed during at least one of the first and second measurement periods.

68. A method as in claim 1, wherein a quantum state of at least one part of the system and a quantum state of at least another part of the system are entangled with each other.

69. A method as in claim 1, wherein a quantum state of at least one part of the system and a quantum state of at least one part of another system are entangled with each other.

70. A method as in claim 1, further comprising changing a quantum property of the system to effect an operation associated with the quantum information of the system.

71. A method as in claim 1, further comprising:

measuring the property of the system at least once during the first measurement period; and before or during the first measurement period, modifying a state of the system to influence the outcome of at least one measurement; and using only one or more of the outcomes of the measurements to represent the first response.

72. A method as in claim 71, wherein the modification includes changing a thermodynamic state of the system.

73. A method as in claim 71, wherein the modification includes inducing a chemical reaction in the system.

74. A method as in claim 71, wherein the modification includes changing a magnetic field applied to the system.

75. A method as in claim 71, wherein the modification includes coherently exciting the system.

76. A method as in claim 71, wherein the modification includes coherently de-exciting the system.

77. A method as in claim 71, wherein the modification it includes coherently altering the system.

78. A method for performing a magnetic resonance measurement on a spin system, sequentially comprising:

preparing a spin system to be in an initial state, the spin system having at least one particle with a non-zero nuclear spin moment;

performing a first measurement on the spin system to produce a first response indicative of a first state of the spin system;

allowing the spin system to evolve with or without applying an electromagnetic field during evolution;

performing a second measurement on the spin system to produce a second response indicative of a second state of the spin system, wherein the spin system retains a degree of memory of the initial state upon commencement of said second measurement; and combining a first function of the first response and a second function of the second response to form a second-order correlation function to extract information indicative of a property of the spin system.

79. A method as in claim 78, wherein the electromagnetic field includes a sequence of electromagnetic pulses.

80. A method as in claim 78, wherein the sequence includes two pulses separated by a time, each pulse operating to rotate the spins by an angle of roughly $\pi/2$ in a suitable frame of reference.

81. A method as in claim 78, wherein the initial state is a nonequilibrium spin state.

82. A method as in claim 78, wherein the spin system is unpolarized in the initial state.

83. A method as in claim 78, further comprising inducing a chemical reaction in the spin system between the first and second measurements.

84. A method as in claim 78, further comprising positioning a magnetic sensor near the spin system to detect a force between the sensor and the spin system.

85. A method as in claim 84, further comprising producing a substantially homogeneous field at the spin system.

* * * * *

UNITED STATES PATENT AND TRADEMARK OFFICE
CERTIFICATE OF CORRECTION

PATENT NO.    : 6,078,872
DATED         : JUNE 20, 2000
INVENTOR(S)   : PAUL J. CARSON, LOIS A. MADSEN, GARRET M. LESKOWITZ AND DANIEL P. WEITEKAMP

It is certified that error appears in the above-identified patent and that said Letters Patent is hereby corrected as shown below:

On the first page of the patent under [75] Inventors:, please correct the first inventors name to:

PAUL J. CARSON

Signed and Sealed this

Eighth Day of May, 2001

Attest:

NICHOLAS P. GODICI

*Attesting Officer*    Acting Director of the United States Patent and Trademark Office